United States Patent [19]
Matsuoka et al.

[11] Patent Number: 5,809,009
[45] Date of Patent: Sep. 15, 1998

[54] DEMODULATOR APPARATUS FOR DIGITAL RADIO COMMUNICATION RECEIVER PROVIDING PSEUDO-COHERENT QUADRATURE DEMODULATION BASED ON PERIODIC ESTIMATION OF FREQUENCY OFFSET

[75] Inventors: Akihiko Matsuoka, Yokohama; Masayuki Orihashi, Ichikawa; Kenichi Takahashi, Kawasaki, all of Japan

[73] Assignee: Matsushita Electric Industrial Co., Ltd., Osaka, Japan

[21] Appl. No.: 710,194

[22] Filed: Sep. 13, 1996

[30] Foreign Application Priority Data

Sep. 13, 1995 [JP] Japan ................................ 7-234907

[51] Int. Cl.⁶ ................................ H04J 3/06; H04L 7/00
[52] U.S. Cl. .......................... 370/206; 370/514; 375/368
[58] Field of Search ...................... 370/206, 500, 370/503, 509, 514; 375/235, 365, 366, 368

[56] References Cited

U.S. PATENT DOCUMENTS 5,222,144  6/1993  Whikehart ............................ 375/340
5,463,627 10/1995  Matsuoka et al. ................... 370/509
5,555,247  9/1996  Matsuoka et al. ................... 370/350

OTHER PUBLICATIONS

IEEE Transactions on Vehicular Technology, vol. 40, No. 2, May 1991 Giovanna D'Aria et al. "Fast Adaptive Equalizers for Narrow–Band TDMA Mobile Radio", pp. 392–404.

*Primary Examiner*—Melvin Marcelo
*Attorney, Agent, or Firm*—Lowe Hauptman Gopstein Gilman & Berner

[57] ABSTRACT

A demoodulator apparatus for a TDM radio receiver successively compares a sampled quadrature baseband signal with a known pilot symbol sequence to detect timings of correlation with a periodically received pilot symbol sequence, with a resultant correlation signal being used in generating a frame synchronizing signal as a basic timing reference signal, and with a degree of dispersion of the correlation signal being detected and used to modify generation of the frame synchronizing signal such as to minimize the effects of adverse radio signal reception conditions on that signal. In addition, demodulation of a quadrature phase-modulated carrier to obtain a quadrature baseband signal is executed by a pseudo-coherent process based on periodic estimation of a frequency offset, with a degree of compensation applied for the offset being accordingly periodically updated, making use of an automatic frequency control loop unnecessary.

19 Claims, 20 Drawing Sheets

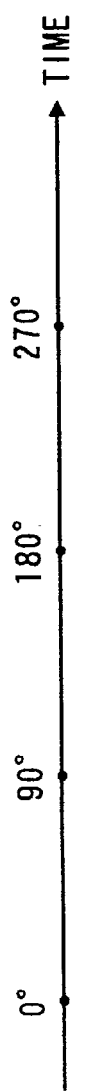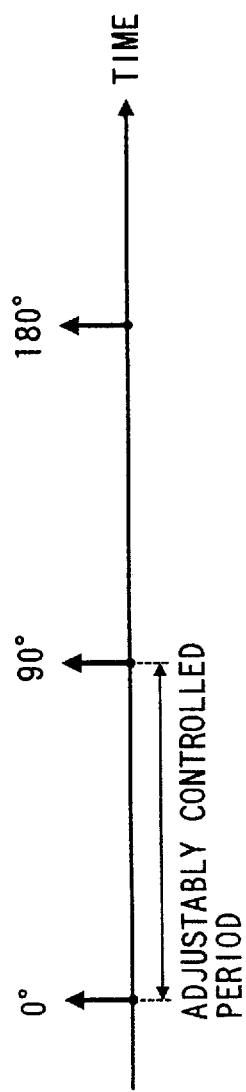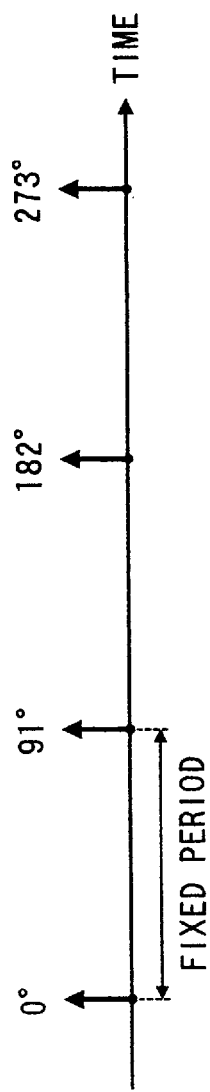
FIG. 15

DEMODULATOR APPARATUS FOR DIGITAL RADIO COMMUNICATION RECEIVER PROVIDING PSEUDO-COHERENT QUADRATURE DEMODULATION BASED ON PERIODIC ESTIMATION OF FREQUENCY OFFSET

BACKGROUND OF THE INVENTION

1. Field of the Invention

The present invention relates in general to a demodulator apparatus for a radio receiver of a TDM (Time Division Multiplex) digital radio communication system.

More specifically the invention relates to a demodulator apparatus to be incorporated in such a TDM digital radio communication receiver whereby the demodulator apparatus receives a phase-quadrature modulated carrier signal which has been derived as an I.F. (intermediate-frequency) signal from a received R.F. (radio-frequency signal, demodulates that I.F. signal to obtain a quadrature baseband signal, and detects periodic occurrences of a pilot signal component in the quadrature baseband signal signal to derive timing information for use in recovering transmitted data from the baseband signal.

2. Description of the Prior Art

In recent years, there has been considerable research and development carried out in the field of TDM radio communication systems for transferring digital data, and in particular TDMA (time division multiple access) systems for mobile vehicle communication. TDMA digital radio has the advantage that each of a plurality of users can transmit using the same carrier frequency, so that only a narrow bandwidth is required. The users are assigned respectively different "time slots" i.e. fixed intervals within each of successive frame periods, so that each transmitting station transmits sequential bursts, in respective frame periods.

With such types of time-multiplex digital radio communication system, it is necessary to implement precise synchronization between a transmitter and the receiver which is receiving data from that transmitter, i.e. to implement symbol synchronization and frame synchronization. Such a radio communication system typically utilizes a modulation method such as QPSK (Quadrature Phase Shift Keying) or MSK (Minimum Shift Keying). However it is known (for example as described by D'Aria et al, in a paper entitled "Fast Adaptive Equalizers for Narrow-Band TDMA Mobile Radio", IEEE Transactions on Vehicular Technology, Vol. 40, No. 2, May 1991) that it is possible to utilize substantially the same quadrature demodulation process to obtain a baseband signal, with MSK modulation, as that which is used for QPSK modulation, if successive pairs of data bits are appropriately encoded prior to MSK modulation and transmission. Use of QPSK modulation will be assumed in the following.

With QPSK modulation, it has been necessary in the prior art to utilize coherent quadrature detection of the received modulated signal, whereby the quadrature reference signals which are used to demodulate the received phase-modulated carrier to a quadrature baseband signal (i.e. reference signals which vary in accordance with $\cos\omega_c t$ and $\sin\Omega_c t$ respectively, where $\Omega_c$ is the radial frequency of the carrier) are held continuously locked in frequency to the received carrier. This is generally accomplished by detecting a frequency offset between these reference signals and the received carrier, and using that error value in an automatic frequency control (AFC) loop which acts on a high-frequency reference signal used in down-converting the received R.F. (antenna) signal to a quadrature phase-modulated I.F. signal. This will enable the I (in-phase) and Q (quadrature) components of the quadrature baseband signal to be accurately obtained from the I.F. signal.

With such a digital data radio system, in which data are transmitted as sets of phase quadrature values expressing sets of symbols in respective periodic frames, each frame (or each burst, in the case of a TDMA system) includes a pilot signal portion which contains a predetermined sequence of symbols, that sequence beginning at a fixed time within each frame period, for use in the aforementioned synchronizing of the receiver with the transmitted data, i.e. for enabling a receiver to acquire the correct phase angle of the received symbols and to generate timing signals which are suitably synchronized with the received symbols within each frame. That predetermined sequence of symbols is held at the receiver, and will be be referred to herein as the pilot symbol sequence. The pilot symbol sequence (which may express a "unique word" that is specific to a particular TDMA channel) can for example be stored in memory or a register at the receiver, to be read out and utilized when necessary.

The receiver detects respective occurrences of the pilot symbol sequence in successive frames, by detecting occurrences of peak correlation between the (locally held) pilot symbol sequence and the received quadrature baseband signal. The time point within a frame period at which peak correlation is detected corresponds approximately to the center of the symbol period of one specific symbol of the pilot symbol sequence. By using that timing information, which defines one specific time point in each frame periods, it becomes possible to generate a frame synchronizing signal as a basic timing reference signal and to thereby generate a symbol synchronization signal which defines the center points of respective symbol periods of a received frame.

In the following description and the appended claims, the terms "symbol period" and "symbol period" of a received radio signal, in the case in which a set of symbols (i.e. burst) is received in a specific time slot within each frame period are to be understood as applying respectively to the repetition period or frequency of symbol occurrence within each set.

The basic configuration of a prior art demodulator section of a digital data radio receiver might be, for example, as shown in the general system block diagram of FIG. 21. Here, the quadrature baseband signal 801 is supplied to a pilot signal detection section 802, which detects each occurrence of the pilot symbol sequence (e.g. based upon the pilot symbol sequence being transmitted at a higher power level than other transmitted data), and supplies each pilot symbol sequence to a correlation detection section 804. The received pilot symbol sequence is compared with the known pilot symbol sequence (e.g. which is being read out in parallel from a register or memory), to detect the time point of maximum correlation. The resultant correlation signal 806 is supplied to a frame synchronizing signal generating section 807, which generates a frame synchronizing signal 808 that is synchronized in phase with the correlation signal 806. The frame synchronizing signal 808 is supplied as a timing reference to a symbol synchronizing signal generating section 809, which generates a symbol synchronizing signal 810.

An improved method of performing such correlation detection to derive a frame synchronizing signal is described in U.S. Pat. No. 5,463,627. With that method, instead of directly comparing the known (i.e. locally stored) pilot symbol sequence with the received pilot symbol sequence to judge correlation, respective vector difference values between each symbol of the pilot symbol sequence and the symbol of the preceding symbol period are derived for the received pilot symbol sequence, are normalized, and are compared with the corresponding normalized vector difference values obtained for the known (i.e. locally stored) pilot symbol sequence to detect correlation. Such a method of comparing difference values has the advantage of greater accuracy and consistency of correlation detection, under a condition of rapid large-scale variations in received signal amplitude, by comparison with a method whereby the symbol values are compared directly.

In addition, that U.S. Pat. No. 5,463,627 describes an improved type of frame synchronizing signal generating circuit for generating a frame synchronizing signal which is phase-locked with such a correlation signal, for providing greater stablity of deriving a frame synchronizing signal (and hence, deriving a symbol synchronizing signal) under conditions of adverse radio reception conditions, i.e. conditions in which there may be considerable amplitude and phase fluctuations (dispersion) of the correlation signal.

However under severe conditions of multi-path fading in the radio communication path, even such a prior art frame synchronizing signal generating circuit may not provide sufficiently rapid recovery from disturbances of the correlation signal due to changes in radio reception conditions, in conjunction with accurate phase lock with the correlation signal during normal radio reception conditions, i.e. conditions in which the correlation signal is relatively stable.

A further problem of the prior art is as follows. It has become increasingly possible to implement many of the functions of a digital radio receiver within a single integrated circuit chip. This is made possible of course, since most of the necessary functions can be performed by digital signal processing. However in order to execute coherent demodulation of a received QPSK or MSK signal, it has been necessary in the prior art to generate quadrature reference signals at a frequency which is accurately locked to that of the received carrier. As is well known, in that case the time points at which the demodulated signal (quadrature baseband signal) should be sampled in order to recover the transmitted symbols correspond to the positions of four points (i.e. a symbol constellation) or four vectors in the I-Q plane. With respect to a periodic sampling signal which is synchronized with the quadrature reference signals, that "symbol constellation" is stationary, under the condition that there is zero frequency offset, i.e. the condition that there is no frequency difference between the received carrier frequency and the quadrature reference signals. However if there is a frequency offset, then rotation of the symbol constellation occurs, at an angular frequency determined by the frequency offset amount and direction.

This illustrated in FIG. 22, in which the nominal positions of the four possible symbol values of a QPSK signal within the I,Q plane are assumed to be as indicated by the circled dots. If there is a frequency offset during quadrature demodulation, then rotation will occur, as indicated, i.e. unpredictable phase angle variations of the quadrature baseband signal will occur with respect to time points at which that signal is periodically sampled to extract the transmitted symbols.

The amount of frequency offset will vary. For example, immediately after power is applied to the radio receiver, or if there is a change in the ambient operating temperature, substantial changes will occur in the amount of frequency offset.

It can thus be understood that if there is an uncompensated frequency offset, then in general it will be impossible to recover the data of the received signal by periodically sampling the respective center points of symbol periods of the baseband signal. For that reason, it is general practice in the prior art to lock the frequency of the quadrature reference signals used for carrier demodulation to the received carrier frequency, by continuously detecting the amount of frequency offset and applying feedback control such as to eliminate the offset. This is generally done by an A.F.C. control loop which controls a high-frequency reference signal (local oscillator signal) used for down-conversion of a received R.F. signal to obtain the I.F. signal.

However such an automatic frequency control (A.F.C) arrangement will usually employ analog circuit components, to some extent. In addition, it may necessitate some degree of adjustment, prior to being set in use. For that reason, the need for such a frequency control loop has been a serious obstacle to the objective of forming all or most of the components of a digital radio receiver on a single I.C. chip, and it would be preferable to provide a digital radio receiver which does not make use of such prior art A.F.C techniques.

SUMMARY OF THE INVENTION

It is an objective of the present invention to overcome the above problems of the prior art set out hereinabove.

Specifically, it is a first objective to provide a demodulator apparatus for a receiver of a TDM digital radio communication system whereby, even under reception conditions of considerable distortion due to a high level of multi-path fading of the received radio signal, stable and accurate control of generating frame synchronization and symbol synchronization signals is maintained.

It is a second objective to provide a demodulator apparatus for a receiver of a digital radio receiver such as a receiver of a TDM radio communication systam, which operates on a received phase-quadrature modulated carrier signal, whereby demodulation of the received modulated carrier to a quadrature baseband signal is performed using asynchronous quadrature demodulation, but whereby amounts of phase rotation error between successive received data symbols are periodically detected and used to derive a frequency compensation value indicative of the amount and direction of frequency offset, with these frequency compensation values being applied to periodically update a parameter which is adjusted such as to compensate for the frequency offset. The frequency offset can thus be effectively compensated in a time-varying manner, although asynchronous quadrature demodulation is employed.

The term "asynchronous quadrature demodulation" as used herein is thus to be understood as signifying "phase quadrature demodulation employing reference quadrature signals having a frequency which is not held continuously locked to the carrier frequency of the signal that is being demodulated, to eliminate a frequency offset, but with means being employed to apply periodically corrected time-varying compensation against the frequency offset."

To achieve the above objectives, according to a first aspect the invention provides a demodulator apparatus for a time-division multiplex digital radio communication receiver, the receiver comprising means for converting a received radio-frequency signal to an intermediate-frequency signal in the form of a phase quadrature modulated carrier, the demodulator apparatus comprising means for sampling and demodulating the modulated carrier to obtain a sampled quadrature baseband signal expressing successive sets of symbols in respective fixed-length frame periods with each set including a predetermined pilot symbol sequence, and frame synchronizing signal derivation means comprising:

memory means having the predetermined pilot symbol sequence stored therein, means for deriving respective normalized first vector difference values between each of adjacent pairs of symbols of the stored pilot symbol sequence, means for successively deriving respective normalized second vector difference values between each of adjacent pairs of samples of the sampled quadrature baseband signal which are time-axis separated by an amount equal to one symbol period, means for sequentially comparing the second vector difference values with the first vector difference values, to obtain a correlation signal, dispersion calculation means for periodically calculating an amount of dispersion of the correlation signal, comparator means for comparing the amount of dispersion with a predetermined dispersion threshold value, to obtain a correlation threshold value as a comparison result, and frame synchronizing signal generating means controlled by the correlation signal and the correlation threshold value for generating a frame synchronizing signal which is synchronized with the frame periods.

According to a second aspect, such a demodulator apparatus can include:

maximum value detection means for detecting a maximum value of the correlation signal in each of the frame periods, to produce a maximum value detection signal, comparator means for comparing the maximum value detection signal with a correlation threshold value, to obtain a comparison signal, correlation threshold value determining means controlled by the comparison signal for producing the correlation threshold value, and frame synchronizing signal generating means controlled by the correlation signal and the correlation threshold value for generating a frame synchronizing signal which is synchronized with the frame periods.

The frame synchronizing signal generating means may for example comprise means for detecting respective amounts of phase error between the correlation signal and the frame synchronizing signal in respective ones of the frame periods, means for obtaining a cumulative value of the phase error over a plurality of successive frame periods, means for detecting when an absolute value of the cumulative phase error exceeds the correlation threshold value, and means for adjusting the phase of the frame synchronizing signal in accordance with the cumulative value of phase error when the correlation threshold value is exceeded.

According to a third aspect, the demoduator apparatus may comprise:

dispersion calculation means for periodically calculating an amount of dispersion of the correlation signal, comparator means for comparing the amount of dispersion with a predetermined dispersion threshold value, to obtain a correlation threshold value as a comparison result, an adaptive equalizer for sequentially processing the extracted quadrature values to obtain a stream of quadrature values to be decoded for recovering originally transmitted data, the processing being controlled based on the correlation threshold value.

In that case, the demodulator apparatus may comprise means controlled by the correlation threshold value for selecting a stream of output quadrature values produced from the adaptive equalizer to be decoded to recover the data when the correlation threshold value is at a first predetermined level and for directly selecting the extracted quadrature values to be decoded to recover the data when the correlation threshold value is at a second predetermined level.

According to a fourth aspect the invention provides a demodulator apparatus for a time-division multiplex digital radio communication receiver, the receiver comprising means for converting a received radio-frequency signal to an intermediate-frequency signal in the form of a phase quadrature modulated carrier, the demodulator apparatus comprising means for sampling and demodulating the modulated carrier to obtain a sampled quadrature baseband signal expressing successive sets of symbols, each set including a predetermined pilot symbol sequence, in respective fixed-length frame periods, means for extracting quadrature values expressing the symbols from the sampled quadrature baseband signal, an adaptive equalizer for processing the extracted quadrature values to obtain successive equalized quadrature values expressing respective equalized symbols, and frame synchronizing signal derivation means comprising:

memory means having the predetermined pilot symbol sequence fixedly stored therein, means for deriving respective normalized first vector difference values between each of adjacent pairs of symbols of the stored pilot symbol sequence, means for successively deriving respective normalized second vector difference values between each of adjacent pairs of samples of the sampled quadrature baseband signal which are time-axis separated by an amount equal to one symbol period, means for sequentially comparing the second vector difference values with the first vector difference values, to obtain a first correlation signal, means for successively deriving respective normalized third vector difference values between each of adjacent pairs of the equalized quadrature values, the values of each the pair being time-axis separated by one symbol period, means for sequentially comparing the third vector difference values with the first vector difference values, to obtain a second correlation signal, delay means acting on at least one of the first and second correlation signals to compensate for effects of a time-axis deviation between the samples of the sampled quadrature baseband signal and corresponding ones of the equalized quadrature values, means for combining the first correlation signal and the second correlation signal to obtain a combined correlation signal, and frame synchronizing signal generating means controlled by the combined correlation signal for generating a frame synchronizing signal which is synchronized with the frame periods.

The means for combining the first correlation signal and the second correlation signal may simply be an adder, for summing the first correlation signal and the second correlation signal.

According to a sixth aspect, the invention provides a demodulator apparatus for a time-division multiplex digital radio communication receiver, the receiver comprising means for converting a received radio-frequency signal to an intermediate-frequency signal in the form of a phase quadrature modulated carrier, the demodulator apparatus including asynchronous baseband demodulator means for converting the intermediate frequency signal to a digital quadrature baseband signal formed of successive quadrature signal samples, comprising:

frequency offset estimation means for executing frequency offset estimation operations to periodically generate respective frequency adjustment values each indicative of an updated estimated value of frequency offset, sampling timing control means responsive to the frequency adjustment values for controlling the frequency of a sampling timing signal, the sampling timing signal frequency being predetermined as taking a value which is N times a nominal value of carrier frequency of the modulated carrier when the frequency offset is zero, where N is a plural integer, analog-to-digital conversion means for converting the intermediate-frequency signal to digital sample values in synchronism with the sampling timing signal, means for deriving successive phase angle values in the range 0° to 360°, with successive increments of 360°/N, in synchronism with the sampling timing signal, means for deriving respective cosine and sine values of each of the phase angle values, and means for multiplying each of the digital sample values by the cosine and sine values, to obtain in-phase and quadrature components of a corresponding one of the quadrature signal samples.

The sampling timing control means of the asynchronous baseband demodulator means can comprise:

cumulative register means for holding a counter preset value which is successively updated by sequential ones of the frequency adjustment values, and presettable counter means coupled to continuously count successive periods of a reference clock signal, and adapted to load therein the counter preset value as an initial count value each time that a predetermined count value is attained.

According to a seventh aspect, the invention provides a demodulator apparatus means for a time-division multiplex digital radio communication receiver, the receiver comprising means for converting a received radio-frequency signal to an intermediate-frequency signal in the form of a phase quadrature modulated carrier, the demodulator apparatus including asynchronous baseband demodulator means for converting the intermediate frequency signal to a digital quadrature baseband signal formed of successive quadrature signal samples, with the asynchronous baseband demodulator means comprising:

frequency offset estimation means for executing frequency offset estimation operations to periodically generate respective frequency adjustment values each indicative of an updated estimated value of frequency offset, means for supplying a fixed-frequency sampling timing signal, having a frequency which is N times a nominal value of frequency of the carrier, analog-to-digital conversion means for converting the intermediate-frequency signal to respective digital sample values in synchronism with the sampling timing signal, phase information register means for holding phase information expressing a phase angle value in the range 0° to 360°, means for deriving a compensation value which is controlled in accordance with the frequency adjustment values, means for periodically updating the phase information by adding thereto the sum of a predetermined initial value and the compensation value, in synchronism with the sampling timing signal, means for deriving respective cosine and sine values of the phase angle value held as the phase information, and means for multiplying each of the digital sample values by the cosine and sine values, to obtain in-phase and quadrature components of a corresponding one of the quadrature signal samples, wherein the initial value is predetermined as being equal to 360°/N.

According to an eighth aspect, the invention provides a demodulator apparatus for a time-division multiplex digital radio communication receiver, the receiver comprising means for converting a received radio-frequency signal to an intermediate-frequency signal in the form of a phase quadrature modulated carrier, the demodulator apparatus including asynchronous baseband demodulator means for converting the intermediate frequency signal to a digital quadrature baseband signal expressing successive sets of symbols in respective fixed-length frame periods, the digital quadrature baseband signal formed of quadrature signal samples derived using a symbol over-sampling factor of m, where m is a plural integer, the asynchronous baseband demodulator means comprising:

frequency offset estimation means for executing frequency offset estimation operations to periodically generate respective frequency adjustment values each indicative of an updated estimated value of an error frequency offset, means for supplying a fixed-frequency signal having a reference frequency which differs from a nominal frequency value of the modulated carrier by an amount $f_{smp}$, where $f_{smp}$ is equal to a nominal value of symbol frequency of the symbols multiplied by the over-sampling factor m, and for obtaining quadrature reference signals varying at the reference frequency, quadrature demodulator means for multiplying the intermediate frequency signal by the quadrature reference signals to obtain a frequency-shifted quadrature baseband signal having an applied frequency offset of $f_{smp}$, sampling timing control means responsive to the frequency adjustment values for controlling the frequency of a sampling timing signal, the sampling timing signal frequency being predetermined as taking a value which is equal to the amount $f_{smp}$ when the error frequency offset is zero, and analog-to-digital conversion means for converting the frequency-shifted quadrature baseband signal to digital sample values in synchronism with the sampling timing signal, to obtain the digital quadrature baseband signal.

With the present invention, it becomes possible to achieve more reliable operation of a TDM digital radio receiver under adverse radio reception conditions, e.g. under heavy multi-path fading which makes it difficult to reliably recover essential timing information (in particular, a frame synchronizing signal) from the received radio signal.

Furthermore, it becomes possible to utilize an asynchronous, i.e. pseudo-coherent form of demodulation of a phase quadrature modulated carrier to obtain the quadrature baseband signal, based on periodic estimates of the amount of frequency offset. Hence, it becomes unnecessary to utilize means such as an automatic frequency control loop in the radio receiver to continuously detect and compensate the frequency offset, thereby facilitating the implementation of the radio receiver in single-chip integrated circuit form, with only simple digital signal processing being employed.

BRIEF DESCRIPTION OF THE DRAWINGS

FIG. 15 is a phase diagram for assistance in describing the operation of the embodiment of FIG. 11;

DESCRIPTION OF PREFERRED EMBODIMENTS

Figure 1:
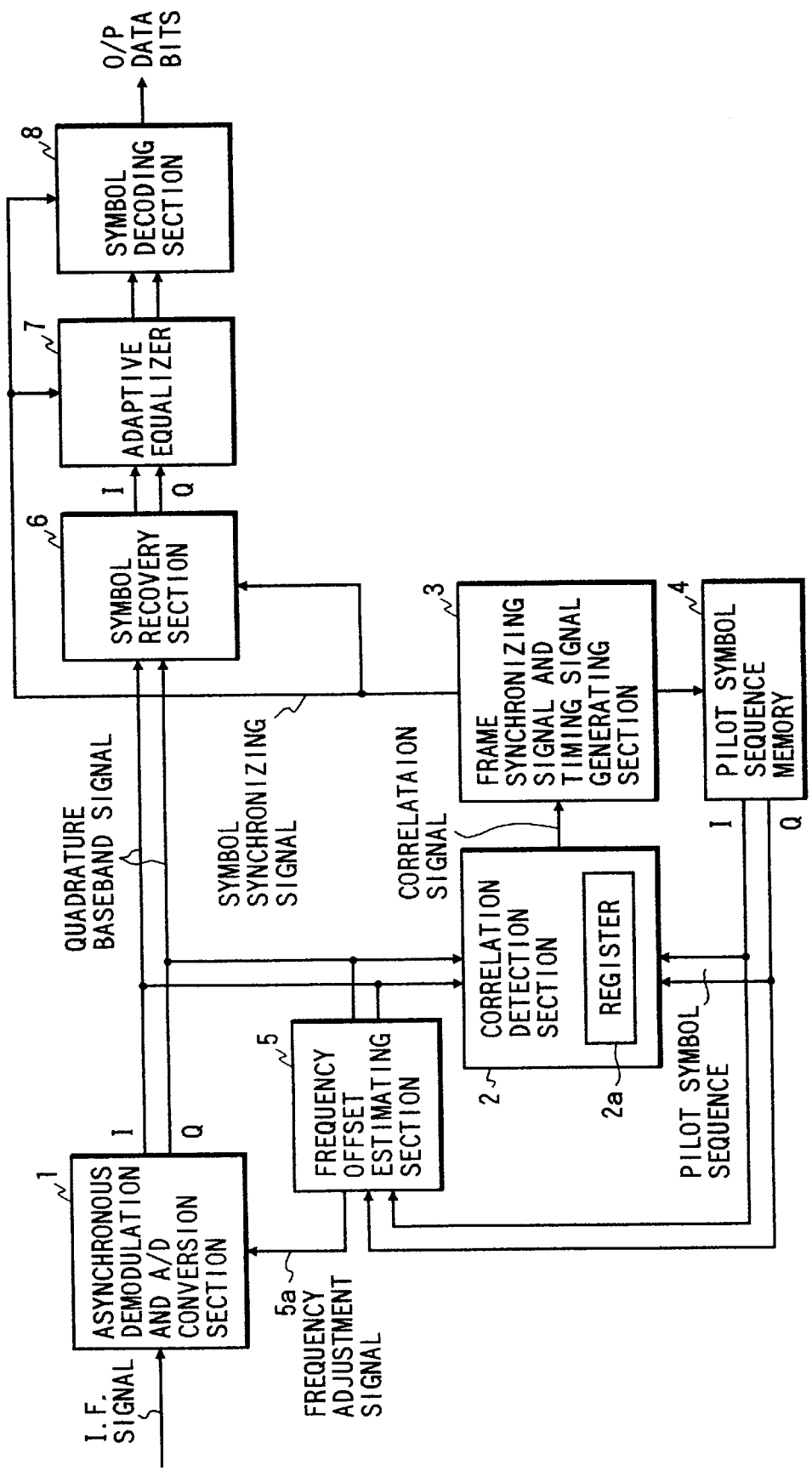
FIG. 1 is a general system block diagram of an example of a demodulation section of a digital radio receiver utilizing asynchronous demodulation based on periodic frequency offset estimation operations.

An example of a basic configuration which might be envisaged for the demodulator section of a TDM radio receiver utilizing embodiments of the present invention is shown, in general system block diagram form, in FIG. 1. Here, a received QPSK-modulated carrier derived as an I.F. signal by down-conversion of a received radio-frequency signal is supplied to an asynchronous demodulation and A/D conversion section 1. The down-conversion has been executed using a fixed-frequency high-frequency reference signal (local oscillator signal), e.g. generated by a frequency synthesizer circuit.

The asynchronous demodulation and A/D conversion section 1 converts the I.F. signal to a the I and Q branches of a quadrature baseband signal signal, through multiplication by phase quadrature reference signals, whose frequency is periodically adjusted in accordance with a frequency adjustment signal 5a, i.e. is not held continuously locked to the frequency of the received carrier by a control loop. The quadrature baseband signal is supplied to a correlation detection section 2 which derives a correlation signal by comparing (as described in greater detail hereinafter) successive sets of vector difference values obtained from the quadrature baseband signal with a set of known vector difference values (e.g. held in a register 2a) of the known pilot symbol sequence which occurs periodically within the received quadrature baseband signal. The pilot symbol sequence is held stored in a memory 4. Time points defined by peak levels of the correlation signal are applied to synchronize the operation of a frame synchronizing signal and timing signal generating section 3, which generates timing signals including a symbol synchronizing signal. The symbol synchronizing signal is supplied to a symbol recovery section 6, which extracts the successive symbols contained in the quadrature baseband signal.

The quadrature baseband signal is also supplied to a frequency offset estimation section 5 which utilizes the locally held pilot symbol sequence (e.g. read out from the memory 4 at appropriate times) to periodically detect an amount of erroneous phase angle rotation between successive received symbols. The frequency offset estimation section 5 uses that error to obtain a frequency adjustment value, indicative of the amount and direction of the frequency offset. These periodically derived frequency adjustment values are supplied to the asynchronous demodulator and A/D conversion section 1, as the frequency adjustment signal, to periodically update information which is used in compensating for the frequency offset, as described in detail hereinafter.

It should be understood that the term "asynchronous" as used in this description and in the appended claims in relation to quadrature demodulation is used with the special significance of "pseudo-coherent". That is to say, rather than providing means such as a PLL (phase-locked loop) for AFC (automatic frequency control) to continuously detect and compensate for an amount of frequency error, i.e. frequency offset, the amount of frequency offset is estimated at periodic intervals (for example, once in each frame period), time axis-varying correction in accordance with that estimated amount of frequency offset is applied, and that correction continues to be applied until the next estimate is made.

It is general practice to utilize an adaptive equalizer 7, to reduce the effects of noise and intersymbol interference on the received symbols. The resultant equalized symbols, (with QPSK, each expressing a pair of data bits) are then decoded in a symbol decoding section 8, to recover the originally transmitted bits.

For successful operation of such a demdulator apparatus, it is essential that certain timing signals (specifically, for controlling the transfer of the symbols of the locally held pilot symbol sequence to the frequency offset estimating section in synchronism with the respectively corresponding symbols of the pilot symbol sequence conveyed by the quadrature baseband signal) be generated by the frame synchronizing signal and timing signal generating section 3 with a high degree of stability and accuracy, in spite of the effects of intermittent periods of severe radio reception conditions. For that reason, it is necessary to accurately and stably generate a frame synchronizing signal as a basic timing reference signal (i.e. specifying the center of a specific symbol period, at the same position within each frame), which is synchronized by the correlation signal from the correlation detection section 2, even under these adverse conditions. Such adverse reception conditions can be caused for example by multi-path fading.

Figure 2:
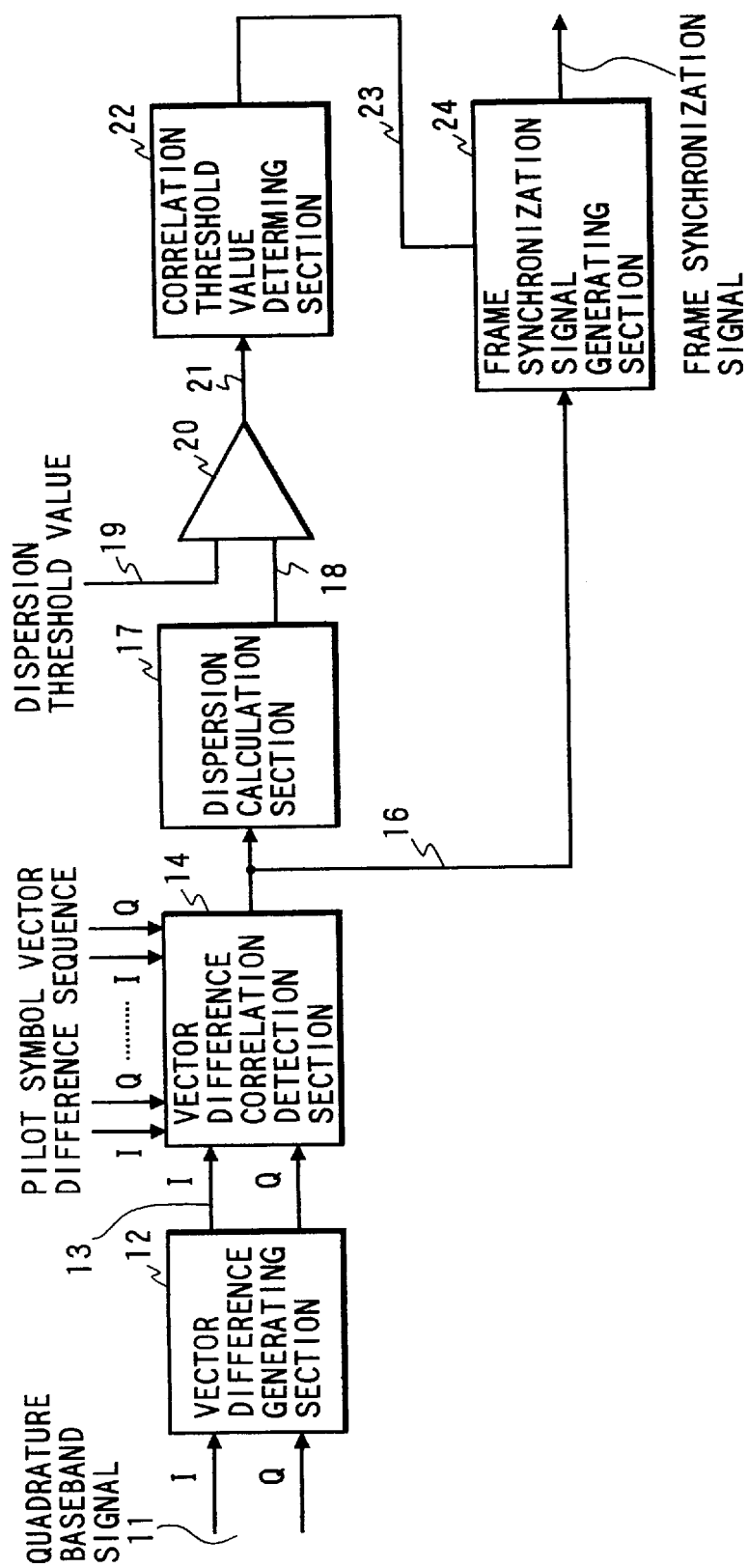
FIG. 2 is a general system block diagram of an embodiment of a frame synchronizing signal derivation section according to the present invention, for use in a demodulator section of a digital radio receiver.

A first embodiment of the invention will be described referring to the system block diagram of FIG. 2, which is a frame synchronizing signal derivation section of a demodulator apparatus such as that of FIG. 1.

This section receives a demodulated digital quadrature baseband signal 11 (obtained by asynchronous quadrature demodulation of an I.F. signal as described above) and derives from the baseband signal 11 a frame synchronizing signal 25. The pair of I, Q values expressed by the quadrature baseband signal signal 11 can be considered as expressing a point in an I-Q plane, i.e. a point whose position is defined by a vector from the origin. The vector difference value generating section 12 operates on the quadrature baseband signal signal 11 such as to derive successive normalized vector difference values, each of which expresses the angular difference between the vector expressed by the quadrature baseband signal signal 11 at one point in time and the vector expressed by signal 11 at a point which occurred one symbol period previously. These vector difference values are compared for correlation with the normalized vector difference values of the pilot symbol sequence (which have been derived and stored beforehand, e.g. in a register) by the vector difference correlation detection section 14. That is to say, successive sets of the received normalized vector difference values are sequentially compared with the set of normalized vector difference values of the pilot symbol sequence, to detect the occurrence of peak correlation. A correlation signal 16 is thereby obtained, which is used (e.g. after peak detection) as a frame timing reference signal for a frame synchronizing signal generating section 26.

Figure 4:
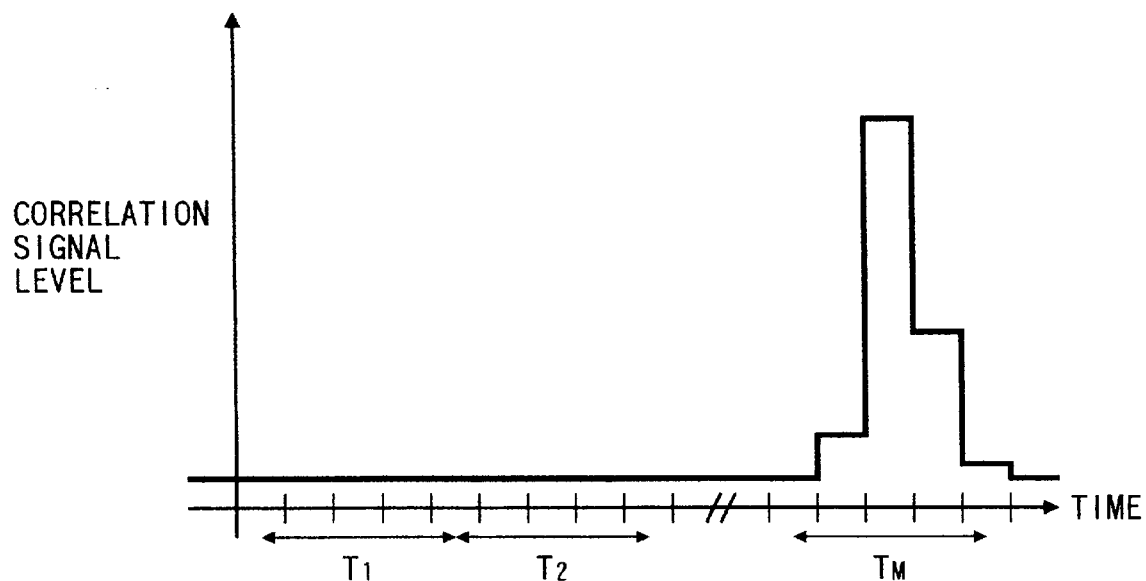
FIG. 4 is a timing diagram showing an example of a correlation signal derived in the frame synchronizing signal derivation section of FIG. 2.

In this embodiment it will be assumed that quadrature baseband signal signal 11 is a parallel pair of (I, Q) digital signals, i.e. obtained by analog-to-digital conversion of a demodulated analog quadrature baseband signal signal, using over-sampling at four times the symbol frequency of the I.F. signal. In that case, there will be four possible timings within each symbol period at which peak correlation can occur. That is illustrated in FIG. 4, in which $T_1$, $T_2$, . . ., TM denote respective symbol periods.

The correlation signal 16 is also supplied to a dispersion calculation section 17, which derives a dispersion value 18, varying in accordance with changes in the degree of dispersion between the successive correlation values that are expressed by the correlation signal 16. That dispersion value signal 18 is then compared with a predetermined dispersion threshold value 13, by a comparator 20. The comparison signal 21 thereby generates a comparison signal 21, indicative of the comparison result obtained. The comparison signal 21 is supplied to a correlation threshold value determining section 22, which thereby determines a correlation threshold value 23 which takes one of two possible values, in accordance with the comparison result.

The correlation threshold value 23 is also supplied to the frame synchronizing signal generating section 24, which generates the desired frame synchronizing signal 25 as a signal which is phase-locked to the correlation signal 16, and which executes adjustment of the phase of the generated frame synchronizing signal 25 in accordance with the level of the correlation threshold value 23, as described hereinafter.

Figure 3:
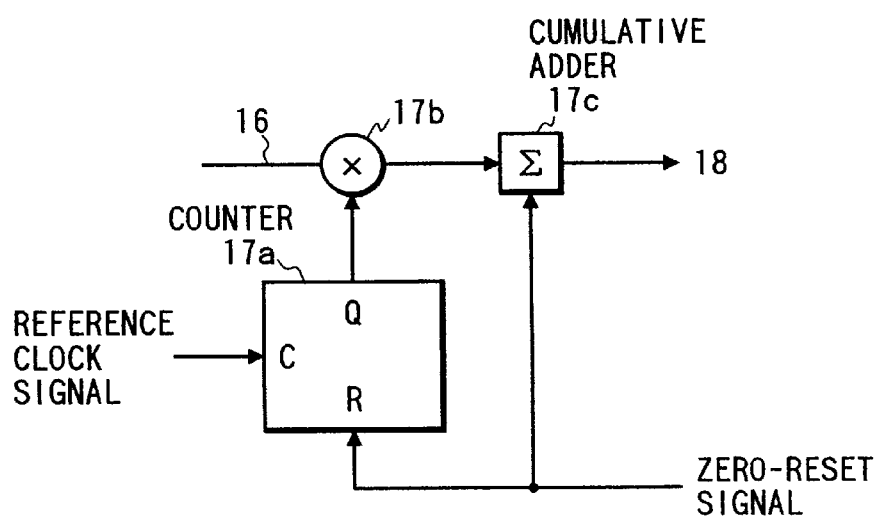
FIG. 3 is a diagram showing an example of the internal configuration of a a dispersion calculation section utilized in the frame synchronizing signal derivation section of FIG. 2.

The dispersion calculation circuit 17 can for example be configured as shown in FIG. 3. Here, the correlation values obtained in successive sample periods are input to a multiplier 17b, while a counter 17a counts successive periods of a reference clock signal, with count value thus obtained being multiplied by the current correlation value in the multiplier 17b. The successive multiplication products are summed in a cumulative adder 17c, with the counter 17a and adder 17c being reset to zero prior to the start of each frame period.

As can be understood from the example of FIG. 4, the point at which peak correlation occurs can be considered as approximately corresponding to the center of a symbol period TM, i.e. is obtained as the baseband signal sample whose sample timing most closely approximates to that center point.

Figure 5:
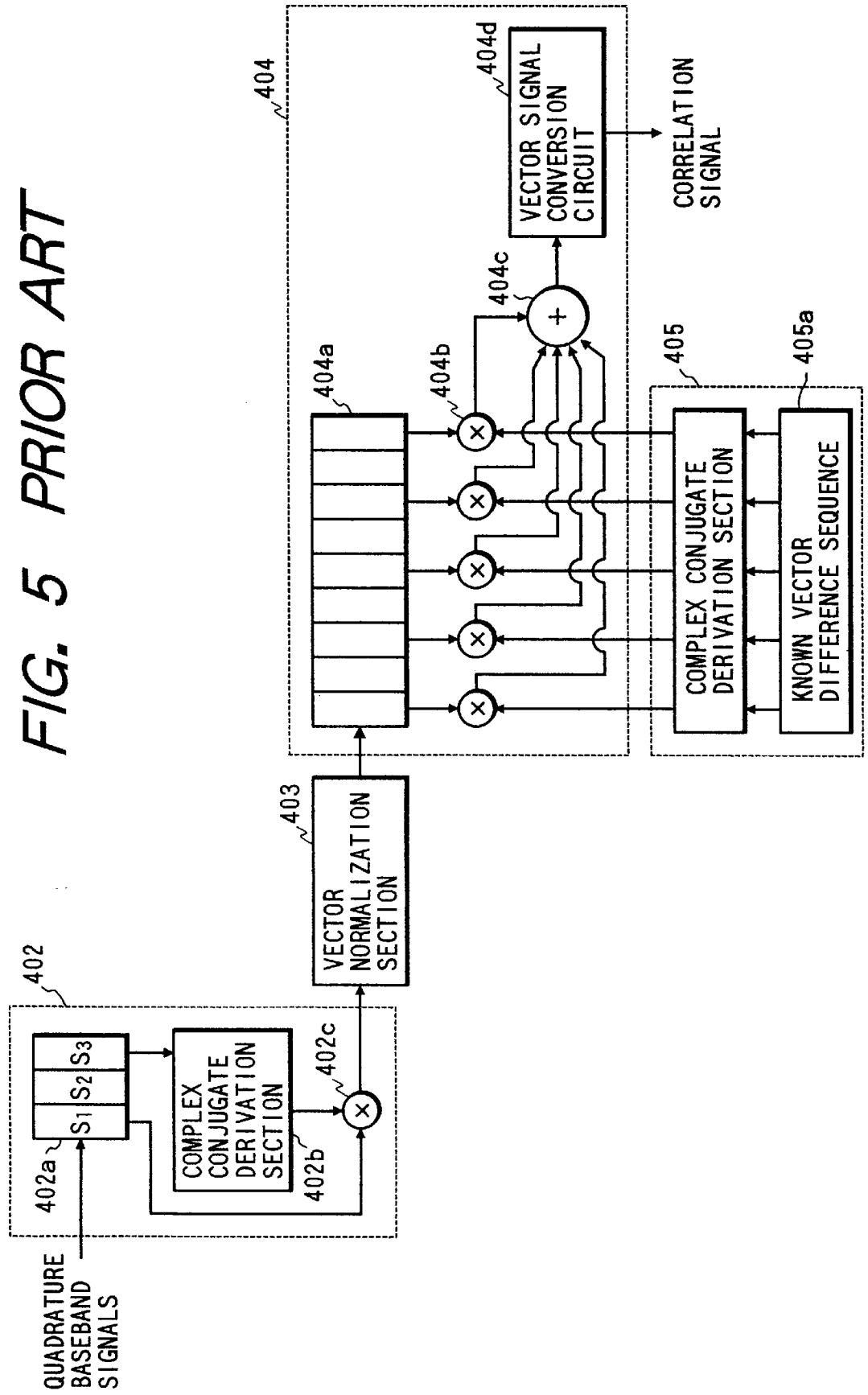
FIG. 5 is a simplified system block diagram of an example of a vector difference correlation detection section utilized in the embodiment of FIG. 2.

A prior art arrangement (described in the above-mentioned U.S. Pat. No. 5,463,627) for implementing the vector difference value generating section 12 and the vector difference correlation detection section 14 is shown in FIG. 5. To simplify the diagram, it is assumed that the quadrature baseband signal signal is sampled at only twice the symbol rate. In addition, a single branch is shown, to represent both of the I and Q branches of the quadrature baseband signal signal. In this case, digital samples which are time-separated by one symbol period are obtained from sections S1, S3 of a shift register, with the complex conjugate of the vector expressed by one of these (quadrature signal) samples being derived in section 402b, and multiplied by the vector expressing the other sample in a multiplier 402c to obtain the vector product. The resultant values are normalized, i.e. to obtain respective amounts of vector rotation between the successive symbols, and are successively set into a shift register 404a in section 404, for detecting correlation with the corresponding normalized known vector difference values of the pilot symbols sequence.

The dispersion calculation section 17 generates the dispersion value 18 by calculations performed on the successive values constituting the vector correlation signal 16 in respective sample periods. If the dispersion value 18 exceeds the dispersion threshold value 19, then the output signal 21 from the comparator 20 attains the logic "1" level, otherwise the output signal 21 attains the logic "0" level.

So long as the comparison signal 21 is at the logic "1" level, the correlation threshold value determining section 22 periodically reduces the correlation threshold value 23 by a predetermined proportion, whereas if the comparison signal 21 is at the logic "0" level, then the correlation threshold value determining section 22 periodically increases the correlation threshold value 23 by the predetermined proportion.

These changes executed in the correlation threshold value 23 can be performed either by addition/subtraction, or by multiplication/division.

Figure 6:
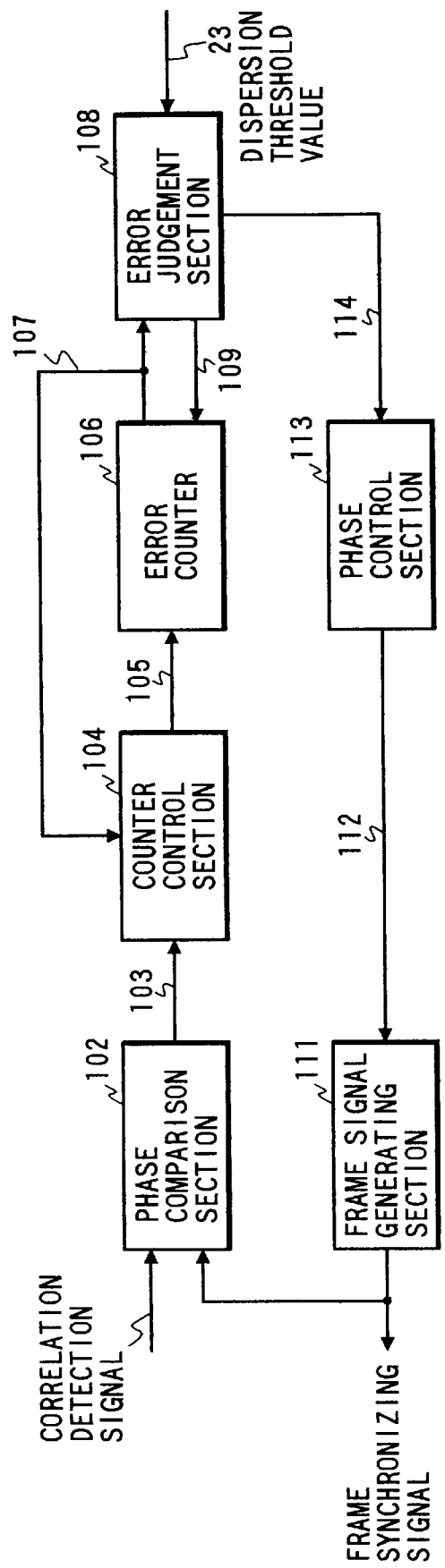
FIG. 6 is a general system block diagram of an example of a frame synchronizing signal generating section utilized in the embodiment of FIG. 2.

An example of a suitable circuit for the frame synchronizing signal generating section 24 is shown in FIG. 6. Here, successive amounts of phase difference between the correlation signal 16 and the frame synchronizing signal 25 (i.e. obtained in successive frame periods) are supplied to a counter control section 104. This, in conjunction with an error counter 106 derives a cumulative amount of phase error, expressed by signal 107, which is supplied to an error judgement section 108. In the error judgement section 108, the absolute value of the cumulative phase error is compared with the correlation threshold value 23. If the cumulative phase error exceeds the correlation threshold value 23, then a corresponding signal 114 indicating that fact, and indicating the direction of the cumulative phase error, is sent to a phase control section 113. The phase control section 113 utilizes successive values of signal 114 to gradually adjust the phase of the frame synchronizing signal 25, by means of a signal 112 which acts on the frame signal generating section 111 that generates the frame synchronizing signal 25. Such an arrangement provides improved stability of deriving the frame synchronization signal when the quality of the received radio signal deteriorates, e.g. due to multi-path fading.

Figure 7:
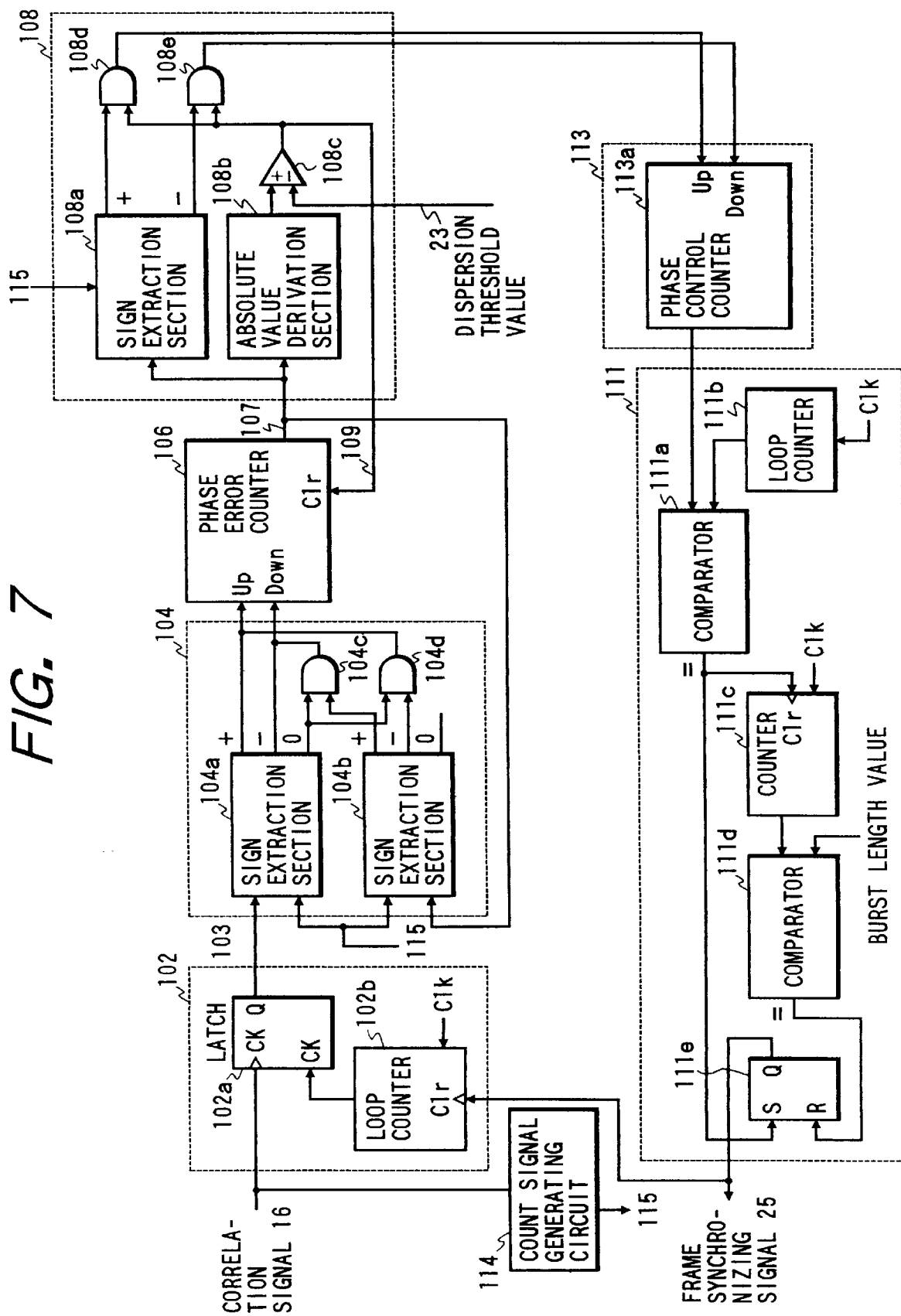
FIG. 7 shows details of the configuration of the frame synchronizing signal generating section of FIG. 6.

FIG. 7 shows details of the internal configuration of the system blocks shown in FIG. 6, in which system blocks corresponding to those of FIG. 5 are designated by corresponding reference numerals. In FIG. 7, the comparison function using the dispersion threshold value 23 is implemented by a comparator 108c in the error judgement section 108. A similar frame synchronizing signal generating apparatus (but using a fixed threshold value for the error judgement section 108) is described in detail in the aforementioned U.S. Pat. No. 5,463,627.

With this embodiment, if the dispersion value expressed by signal 18 exceeds the predetermined threshold value 19, then the correlation threshold value 23 is successively reduced, whereas if the dispersion value 18 of the vector correlation signal 16 does not exceed the predetermined value 19, then the correlation threshold value 23 is successively increased. As a result, even if the received radio signal from which the quadrature baseband signal signal 11 is obtained has been transmitted over a path which produces severe multi-path fading, so that there are considerable variations in the absolute values of vector correlation, adaptively optimized values are set for the correlation threshold value that is used in controlling phase correction of the generated frame synchronizing signal. Thus with this embodiment, the correlation threshold value controls a frame synchronizing signal generating section in such a manner that adjustment of phase of the generated frame synchronizing signal 25 in accordance with detected phase errors between the frame synchronizing signal 25 and the correlation signal 16 is enabled only so long as a detected phase error quantity exceeds that threshold value. This enables stable control of the phase of the frame synchronizing signal to be achieved, by ensuring that timing control of the frame synchronizing signal will not be disturbed by momentary incorrect error information that has been generated as a result of a temporary condition of poor radio signal reception (as indicated by the degree of dispersion of the correlation detection signal which is used as a phase reference by the frame synchronizing signal generating section), while maintaining a sufficiently high speed of response to changes in the amount of phase error (between the frame synchronizing signal and the correlation signal) during normal radio reception operation.

Figure 8:
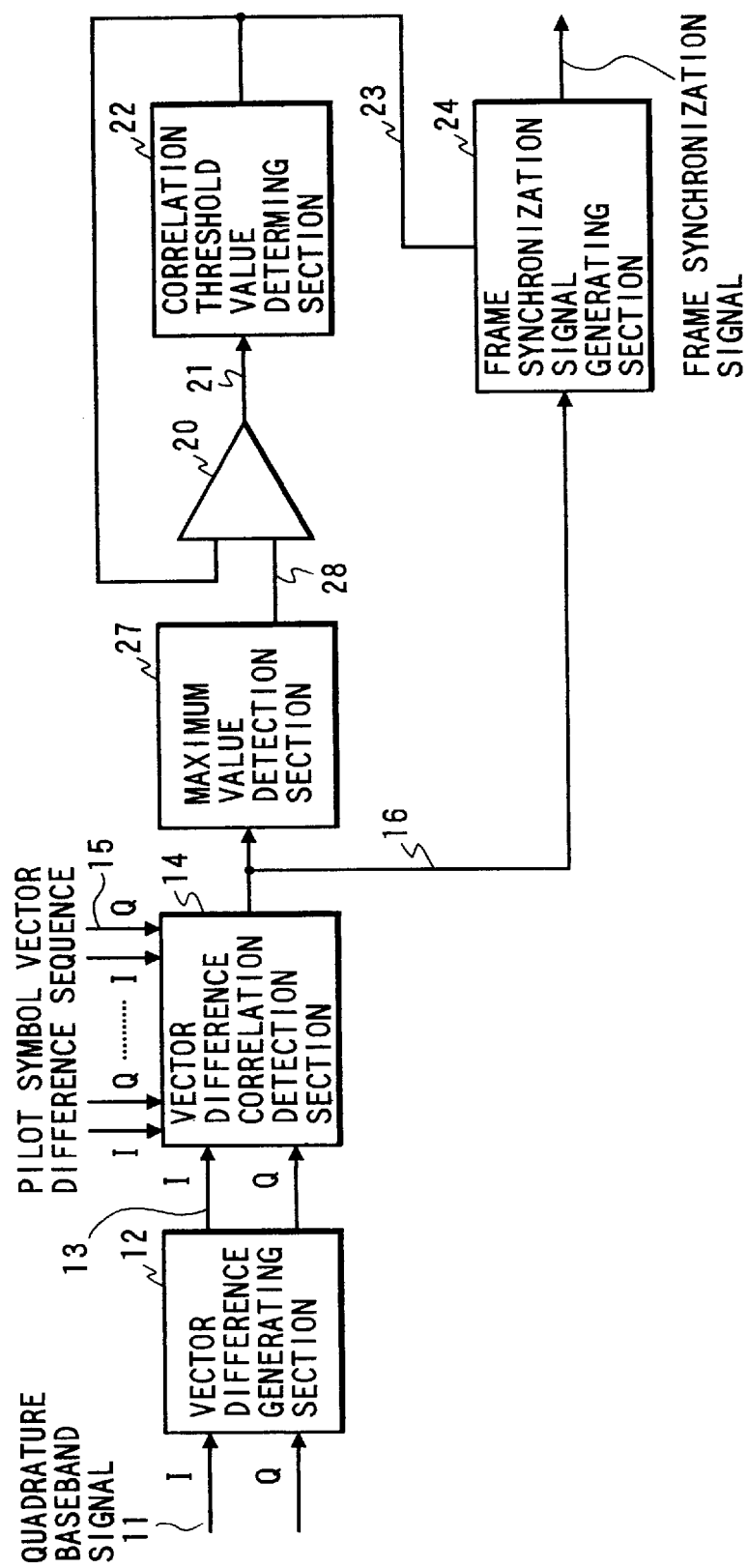
FIG. 8 is a general system block diagram of a second embodiment of a frame synchronizing signal derivation section according to the present invention, for use in a demodulator section of a digital radio receiver.

A second embodiment of the invention will be described referring to FIG. 8, which also is a frame synchronizing signal derivation section of a demodulator apparatus of a TDM digital radio receiver. Only the points of difference between this embodiment and the preceding embodiment will be described in detail. This embodiment differs from the preceding embodiment in that the vector correlation signal 16 is supplied to a maximum value detection section 27 which detects peak levels of correlation signal 16, rather than the dispersion calculation section 17 of FIG. 2. The maximum value detection section 27 produces an output signal 28 expressing detected maximum values of the vector correlation signal 16, which is supplied to one input of the comparator 20. A second point of difference between this embodiment and the preceding embodiment is that instead of supplying the predetermined value 19 to the other input of the comparator 20, the output correlation threshold value 23 from the correlation threshold value determining section 22 is supplied to that other input of the comparator 20, to be compared with the correlation maximum value signal 28.

With this embodiment, the vector difference correlation section 14 derives the vector correlation signal 16 as described for the first embodiment, and supplies the vector correlation signal 16 to the frame synchronizing signal generating section 24 and to the maximum value detection section 27. The maximum value detection section 27 detects respective maximum values of the vector correlation signal 16, in each of successive frame periods, and produces the signal 28 which expresses these maximum values. That signal is compared with the correlation threshold value 23 by the comparator 20, and if the maximum value of the correlation signal during a frame period, expressed by maximum value signal 28, exceeds the current magnitude of the correlation threshold value 23, then the output signal 21 from the comparator 20 attains the logic "1" level, otherwise the output signal 21 from the comparator 20 attains the logic "0" level. In each frame period for which the comparison signal 21 is at the "1" level (i.e. indicating that high peak levels of the correlation signal are being derived, so that accurate correlation detection can be assumed), the correlation threshold value determining section 22 reduces the magnitude of the correlation threshold value 23 by a predetermined proportion, whereas in each frame period for which the comparison signal 21 is at the logic "0" level, the correlation threshold value determining section 22 increases the magnitude of the correlation threshold value 23 by a predetermined proportion.

In the same way as described for the first embodiment, these changes executed in the correlation threshold value 23 can be performed either by addition/subtraction, or by multiplication/division.

Thus with this embodiment as for the preceding embodiment, the correlation threshold value (i.e. which determines the magnitude which a detected phase error quantity must attain before that phase error amount is applied to adjust the phase of the frame synchronizing signal) is varied in accordance with the radio reception condition, as indicated by the peak values of the correlation signal that is derived. As a result, stable and accurate operation of the frame synchronizing signal generating section 24 can be ensured, even under conditions of severe multipath fading of the received radio signal.

A third embodiment of the invention will be described referring to the system block diagram of FIG. 9. A digital radio communication receiver such as a TDMA radio receiver generally incorporates an adaptive equalizer, as mentioned hereinabove, which processes successive pairs of (I, Q) values expressing respective received symbols, to reduce the effects of noise and intersymbol interference. Since use of an adaptive equalizer for this function is well known, detailed description will be omitted. Such an adaptive equalizer is generally based on the use of transversal filters. While information symbols are being received and successively input to the equalizer, predicted values for each output symbol are derived and are compared with the corresponding values which are actually obtained from the output of the equalizer. The resultant error quantities are applied to successively modify the filter coefficients (in general, transversal filter tap coefficients), to adaptively optimize the equalizer operation.

However if the receiver temporarily enters a condition of very poor signal reception (as will occur periodically during multipath fading, for example), then the adaptive adjustment operations on the filter coefficients may no longer be valid. As a result, during such an interval of poor signal reception, the filter tap coefficients may become set to inappropriate values, and some time will then be required for the system to adaptively readjust these tap coefficients to appropriate values after returning to a condition of more normal radio reception. Thus, a sufficiently rapid response of the receiver operation to changes in reception conditions may not be achieved.

The function of this embodiment is to ensure that processing of the received symbol values by the adaptive equalizer (and hence, adjustment of the filter coefficients based upon the received symbol stream) is executed only under appropriate radio reception conditions. To achieve this, the adaptive equalizer can be selectively changed between a first condition, in which the above-described processing of received symbols and adaptive adjustment of the filter coefficients is executed, and a second condition, in which the adaptive equalizer is by-passed by the stream of received symbols, and the filter coefficients are left unchanged. Control of switching between the enabled/ disabled condition of adaptive equalizer operation is executed by a comparison signal 21 shown in FIG. 9, which is generated in the same manner as for the comparison signal 21 of the first embodiment shown in FIG. 2. In FIG. 9, system blocks which are identical in function to system blocks in FIG. 2 are designated by respectively corresponding numerals, and detailed description of these will be omitted. Specifically, the vector difference value generating section 12, vector difference correlation section 14, dispersion calculation section 17 and comparator 20 are respectively connected in the same way as for the first embodiment, with the quadrature baseband signal signal 11 being supplied to the vector difference value generating section 12, and the dispersion value 18 being thereby obtained from the dispersion calculation section 17 and compared with the dispersion reference value 19 by the comparator 20, to thereby obtain the comparison signal 21.

Figure 9:
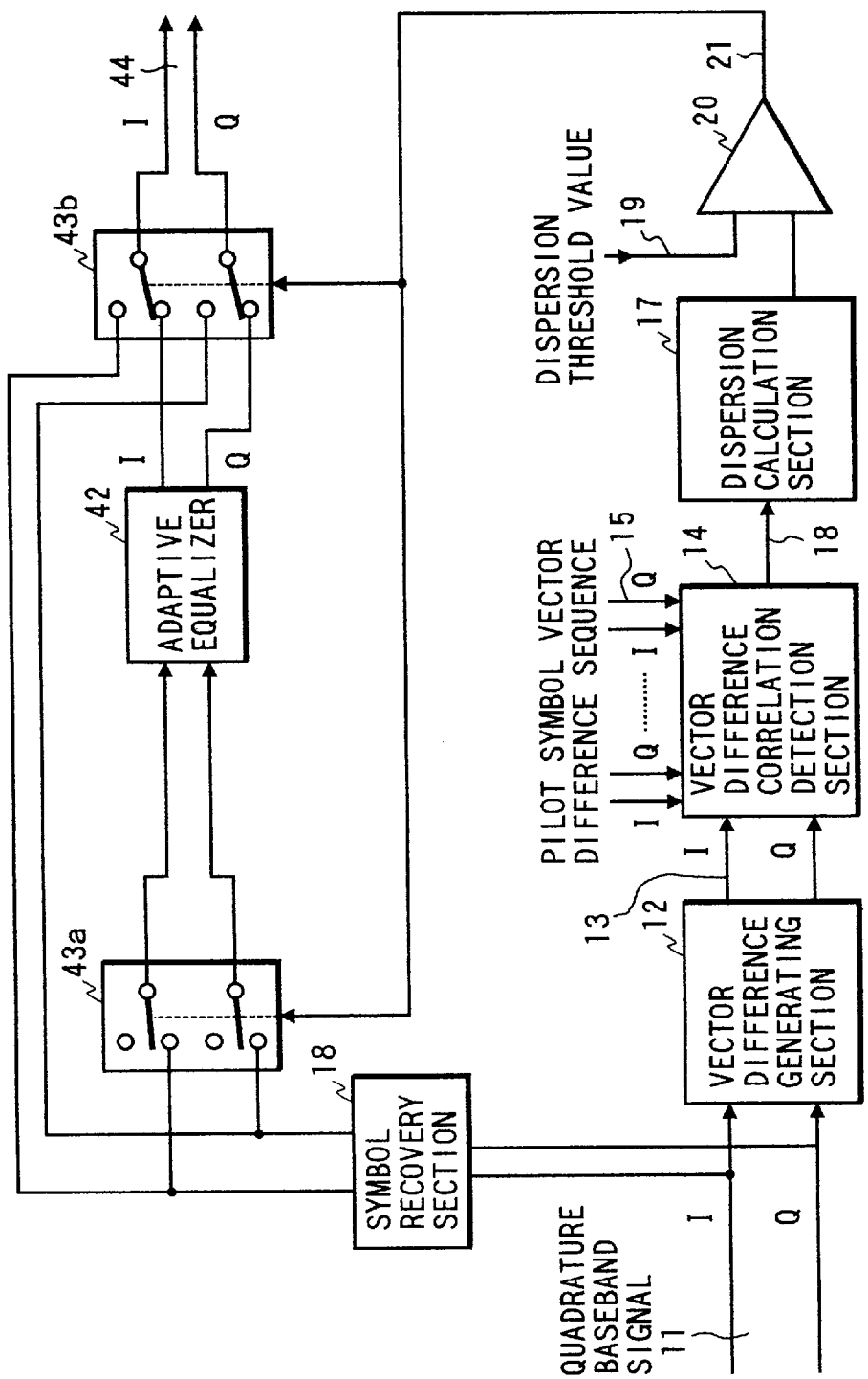
FIG. 9 is a general system block diagram of an embodiment of an adaptive equalizer control section for use in a demodulator section of a digital radio receiver, for controlling the operation of an adaptive equalizer in accordance with dispersion of a correlation signal.

In FIG. 9, a pair of ganged changeover switches 43a and 43b, each controlled by the comparison signal 21, respectively select the quadrature input signal which is supplied to the adaptive equalizer 42 and the quadrature output signal obtained from the adaptive equalizer 42, to be transferred to a symbol decoding section (not shown in the drawing) to be decoded to recover the transmitted bit data stream. Specifically, the input switch 43a either supplies the received symbol stream to the input of the adaptive equalizer 42, or isolates the input of the adaptive equalizer 42. The output switch 43b selects either the output from the adaptive equalizer 42 or the received (unequalized) symbol stream.

It should be understood that the switches 43a, 43b will in practice be implemented as semiconductor switching devices, controlled by the signal 21.

With this embodiment, so long as the dispersion value 18 exceeds a dispersion reference value 19 (resulting in a "1" logic level output value being produced as the comparison signal 21), the equalized symbol values derived by the adaptive equalizer 42 are selected by the switch 43b, as the output signal 44 which is decoded to recover the original data stream. If the dispersion value 18 does not exceed the dispersion reference value 19 (i.e. a "0" logic level output value is produced as the comparison signal 21), the switch 43a is controlled by the comparison signal 21 to directly select the quadrature baseband signal 11 as the output signal 44, i.e. that signal is obtained as a stream of non-equalized values, and the internal condition of the equalizer is left unchanged.

As a result, with this embodiment, when the transmission path of the received radio signal temporarily deteriorates due to a cause such as multi-path fading, thereby causing time-axis variations of the delay dispersion of the received radio signal, it becomes possible to prevent deterioration of the error rate of the equalizer 42 during the intervals of normal radio reception, when the delay dispersion of the received radio signal is small. That is to say, it becomes possible to achieve a decrease in the error rate of the received data, by comparison with the conventional method of utilizing the adaptive equalizer continuously irrespective of the condition of the received baseband signal.

A fourth embodiment of the invention will be described referring to the system block diagram of FIG. 10. This embodiment relates to the functions of a digital radio receiver demodulator section whereby adaptive equalization of received symbols is performed as described above, and whereby timing signals, including a frame synchronizing signal and a symbol synchronizing signal which is synchronized with respective symbol periods of the received symbols, are derived based on detection of correlation of normalized vector difference (i.e. vector angular difference) correlation between the received quadrature baseband signal and the locally held (known) pilot symbol sequence.

Figure 10:
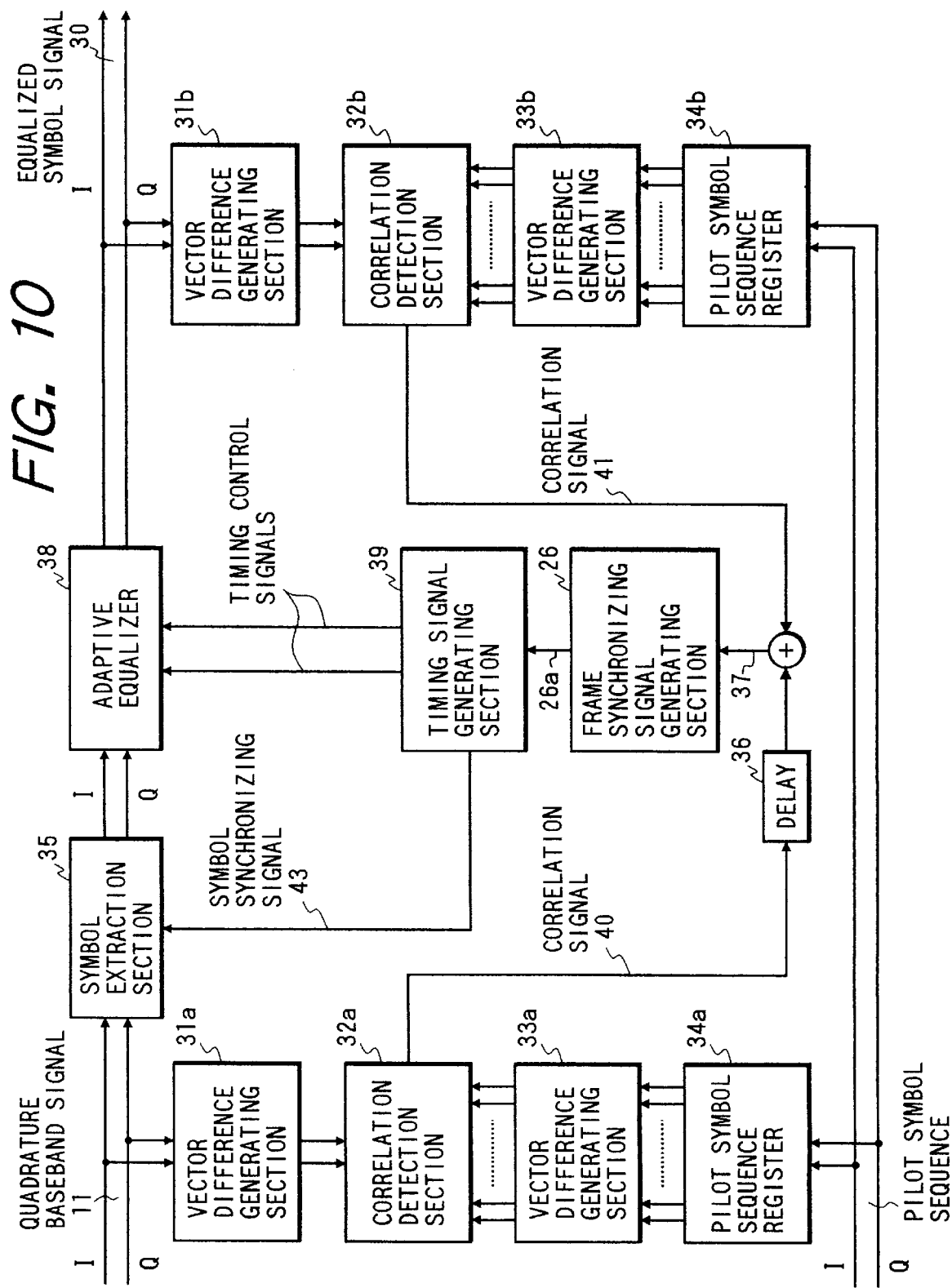
FIG. 10 is a general system block diagram of an embodiment of a synchronization signal determining section for use in a demodulator section of a digital radio receiver, for deriving a correlation signal to synchronize the operation of a frame synchronizing signal generating section based upon both a correlation signal obtained from a non-equalized quadrature baseband signal and a correlation signal obtained from a corresponding adaptively equalized symbol stream.

In FIG. 10, the operation of a frame synchronizing signal generating section 26 is synchronized with a combined correlation signal (derived as described hereinafter) to generate a frame synchronizing signal 26a. A timing signal generating section 39, whose operation is synchronized with the frame synchronizing signal 26a, generates timing signals including timing control signals for controlling the operation of a adaptive equalizer 38 and a symbol synchronizing signal which is applied to a symbol extraction section 35. The symbol extraction section 35 receives successive I,Q sample pairs of a digital quadrature baseband signal 11, and selects those samples which most closely correspond in timing to the centers of respective symbol periods, as specified by the symbol synchronizing signal 43, to thereby recover the transmitted symbols, as respective quadrature (I, Q) values in respective symbol periods. These are supplied to the adaptive equalizer 38, and a resultant stream of equalized symbols 30 is obtained, to be subsequently decoded.

The quadrature baseband signal signal 11 is also supplied to a vector difference value generating section 31a, which produces a vector difference signal 13 that is supplied to a correlation detection section 32a. A register 34a holds the pilot symbol sequence values (e.g. which have been read out from memory and set therein), and supplies these to a vector difference value generating section 33a, whose derived values are input to the correlation detection section 32a, to thereby obtain a correlation signal 40, i.e. which attains a peak value at one specific time point in each frame period as described hereinabove. The equalized symbol stream 39 produced from the timing signal generating section 39 is similarly processed, by a vector difference value generating section 31a, correlation detection section 32b, vector difference value generating section 33b, and pilot symbol sequence register 34b, with a correlation signal 41 being thereby obtained.

The correlation signal 40 is transferred through a delay element 36, which applies an amount of delay that is equal to the delay from the input of the symbol extraction section 35 to the output of the adaptive equalizer 38, thereby ensuring that the correlation signals 40 and 41b can be accurately combined to obtain a combined correlation signal 37. The combined correlation signal 37 is supplied to the frame synchronizing signal generating section 26. In this embodiment, the combined correlation signal 37 is obtained by summing the correlation signals 40, 41.

Thus with this embodiment, the correlation signal 41 which is derived from the waveform-equalized symbol signal 30 is utilized in combination with the correlation signal 40 that is derived based on the non-equalized quadrature baseband signal, to perform precise adjustment of the phase of the frame synchronizing signal that is produced by the frame synchronizing signal generating section 26. It has been found that by utilizing this technique, even if the radio signal from which the quadrature baseband signal signal 11 is obtained is being transmitted over a path which exhibits multi-path fading, causing time-axis variations in the delay dispersion of the received radio signal, the effects of such disturbances on the frame synchronizing signal (and hence on the other timing signals which are linked thereto) can be substantially reduced. Hence, the operation of the radio receiver can be made less sensitive to intermittent deterioration of radio reception conditions.

With this embodiment, separate system blocks are shown for corresponding portions of the system which derive the correlation signal 40 directly from the quadrature baseband signal and derive the correlation signal 41 from the equalized output symbol stream (e.g. the pair of blocks 31a and 31b). However it may be possible to replace all or part of these pairs of blocks by respective single blocks, used for deriving both of the correlation signals on a time-sharing basis.

A fifth embodiment of the invention will be described referring to the system block diagram of FIG. 11. The function of this embodiment basically corresponds to that of the asynchronous demodulation and A/D conversion section 1 and frequency offset estimation section 5 in the demodulator section example of FIG. 1. With this embodiment, the I.F. signal (i.e. phase quadrature modulated carrier) is subjected to A/D conversion at an adjustable sampling rate before being demodulated to obtain the quadrature baseband signal signal. That is to say, the quadrature demodulator circuit receives successive digital samples of the modulated carrier. As such samples are successively received by the demodulator respective digital values of quadrature reference signals are generated and are multiplied by the input samples, to obtain I and Q components of a (digital) quadrature baseband signal signal.

It is an essential feature of this embodiment that the phase angle values which are cyclically attained by the digital quadrature reference signals, in synchronism with successive sample periods, are fixed. Assuming for example that the I.F. signal is sampled at a frequency which is exactly four times the carrier frequency, and that the modulator quadrature reference signal values are generated in synchronism with the I.F. signal samples, then if there is no frequency offset, quadrature demodulation can be achieved by generating each of the quadrature reference signals used for demodulation as a cyclic sequence of values $\{0, -1, 0, 1, 0 \ldots\}$, i.e. as a succession of sine values and a succession of cosine values respectively, for the phase angles 0°, 90°, 180°, 0°, generated in synchronism with successive sample timings.

With this embodiment, if a frequency offset arises, then this signifies that the sampling frequency has changed from the condition of being exactly four times the (actual, received) carrier frequency. If the sampling frequency is increased, this has the same effect as increasing the demodulation quadrature reference signal frequency in relation to the received carrier frequency, while a decrease in the sampling rate has the opposite effect on the frequency offset. This is the basis for the embodiment of FIG. 11.

Figure 11:
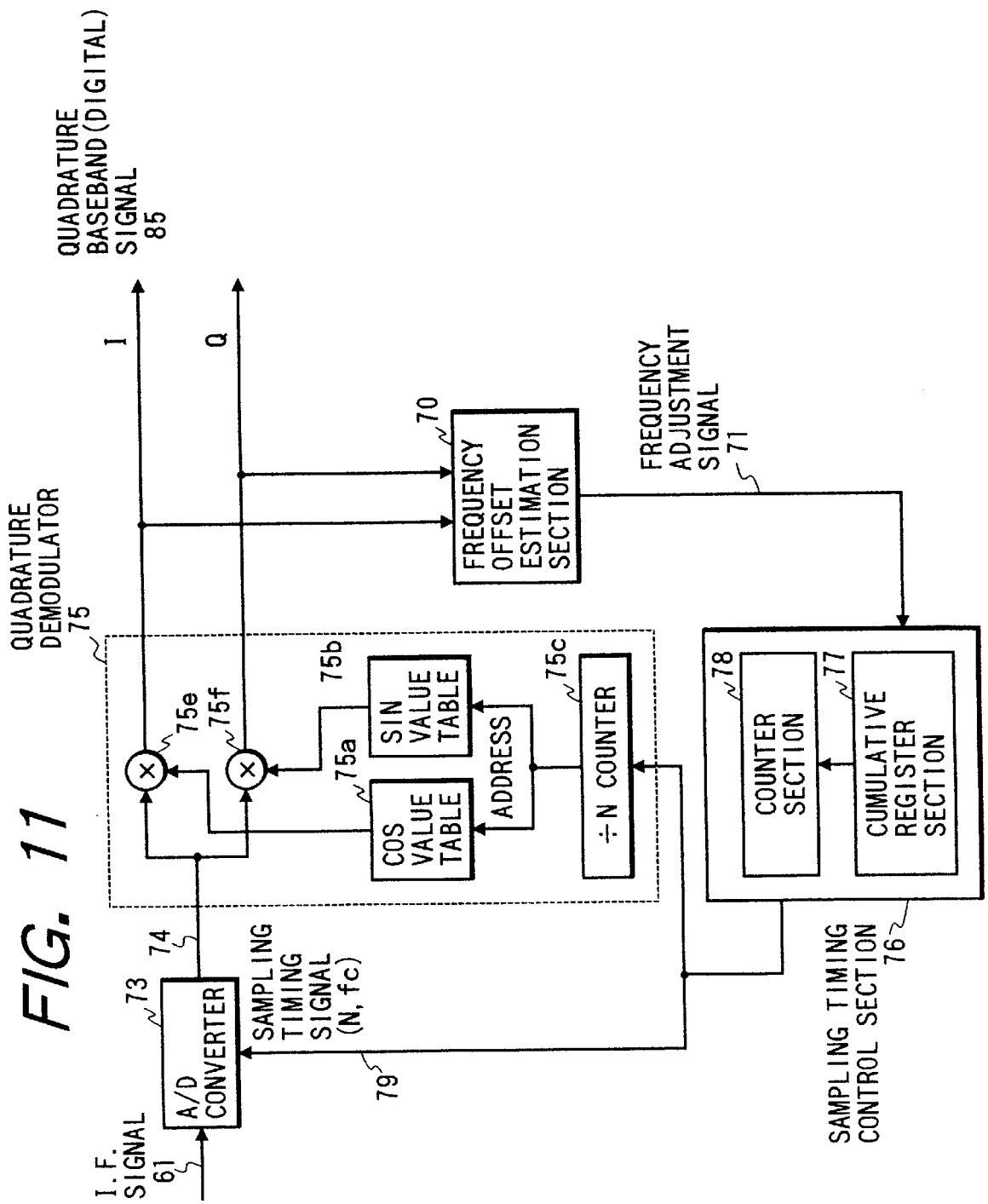
FIG. 11 is a general system block diagram of a first embodiment of an asynchronous quadrature demodulator according to the present invention for use in the demodulator section of a digital radio receiver, for deriving a digital quadrature baseband signal with frequency offset compensation being based on control of the period of sampling timings.

In FIG. 11, the modulated I.F. signal 61 of the radio receiver is supplied to an A/D converter 73, which is controlled by a sampling signal 79 supplied from a sampling timing control section 76, with a digital I.F. signal 74 produced by the A/D converter 73 then being supplied to a phase quadrature demodulator 75, to obtain a digital quadrature baseband signal signal 76. The quadrature baseband signal signal 76 is supplied to a frequency offset estimating section 70, which executes a frequency offset estimation operation each time the pilot symbol sequence is received, i.e. once in each frame period of the received signal. The frequency offset estimation section 70 generates a frequency adjustment signal 71, consisting of respective values derived in the frequency estimation operations, each value determined by amount and direction of the estimated frequency offset. As described hereinafter, the frequency offset value is preferably estimated by detecting an amount of phase rotation error which occurs between successive received symbols (i.e. of the pilot symbol sequence). The frequency adjustment signal 71 is applied to periodically update a value held in a cumulative register section 77 in the sampling timing control section 76, with that value being periodically loaded into a presettable counter in a counter section 78, as an initial count value, such as to control the count period of that counter. (Here, "cumulative register" signifies a register whose contents are periodically updated by adding thereto a new input value). The count period of the counter section 78 determines the sampling period of a sampling timing signal 79 which is supplied to the A/D converter 73. Generation of the aforementioned quadrature demodulation reference signal values in the quadrature demodulator 75 is synchronized with that sampling operation. In this example, for simplicity of description, the sampling timing signal 79 is shown as being supplied to a modulo-N counter 75c, (i.e. designating the sampling frequency as being N times the carrier frequency), with the resultant count values being supplied as address values for cosine and sine tables 75a, 75b. However in practice of course, if the quadrature reference signal values are within a small range (e.g. limited to 1, 0, −1, if N=4), a simpler circuit arrangement could of course be used to generate these values.

Although not shown in the drawing, the phase quadrature demodulator 75 includes the necessary low-pass filters for removing unwanted frequency components from the demodulated quadrature baseband signal signal.

With the above embodiment, each time a frequency offset estimation operation is performed, a value indicative of the amount of estimated offset is passed to the sampling timing control section 76, as the frequency adjustment signal 71. For example if a phase rotation error of 3° occurs between two successive received symbols, then the value 3 could be passed as a corresponding value of the frequency adjustment signal 71. However it would be possible, as an alternative configuration of the above embodiment, to limit the range of values which can be passed to the sampling timing control section 76, as the frequency adjustment signal 71. Specifically, these values can be restricted to being either 1 or −1. This will ensure greater stability of frequency offset compensation, but will cause a reduced speed of response to rapid changes in the amount of frequency offset.

In general the amount of frequency offset will be substantial during a "warming up" interval after power is first switched on to the radio receiver, and will then substantially decrease. For that reason, a second alternative form of this embodiment can be configured such that when operation of the radio receiver is started, the positive or negative numeric value representing the amount and direction of amount of frequency offset which is currently estimated at that time by the frequency offset estimating section 70 is periodically added to the contents of the counter reset value register 68 of the sampling timing control section 67 as described above, with that mode of operation being continued until a predetermined time interval has elapsed. Thereafter, a second mode of operation is entered, whereby the frequency adjustment signal 71 can take only the values 1 or −1 as described above. This will allow sufficiently rapid compensation for the large amount of frequency offset which arises immediately after operation of the radio receiver is started, while ensuring stable and accurate compensation for the small degree of frequency offset which can generally be anticipated during normal operation.

Figure 12:
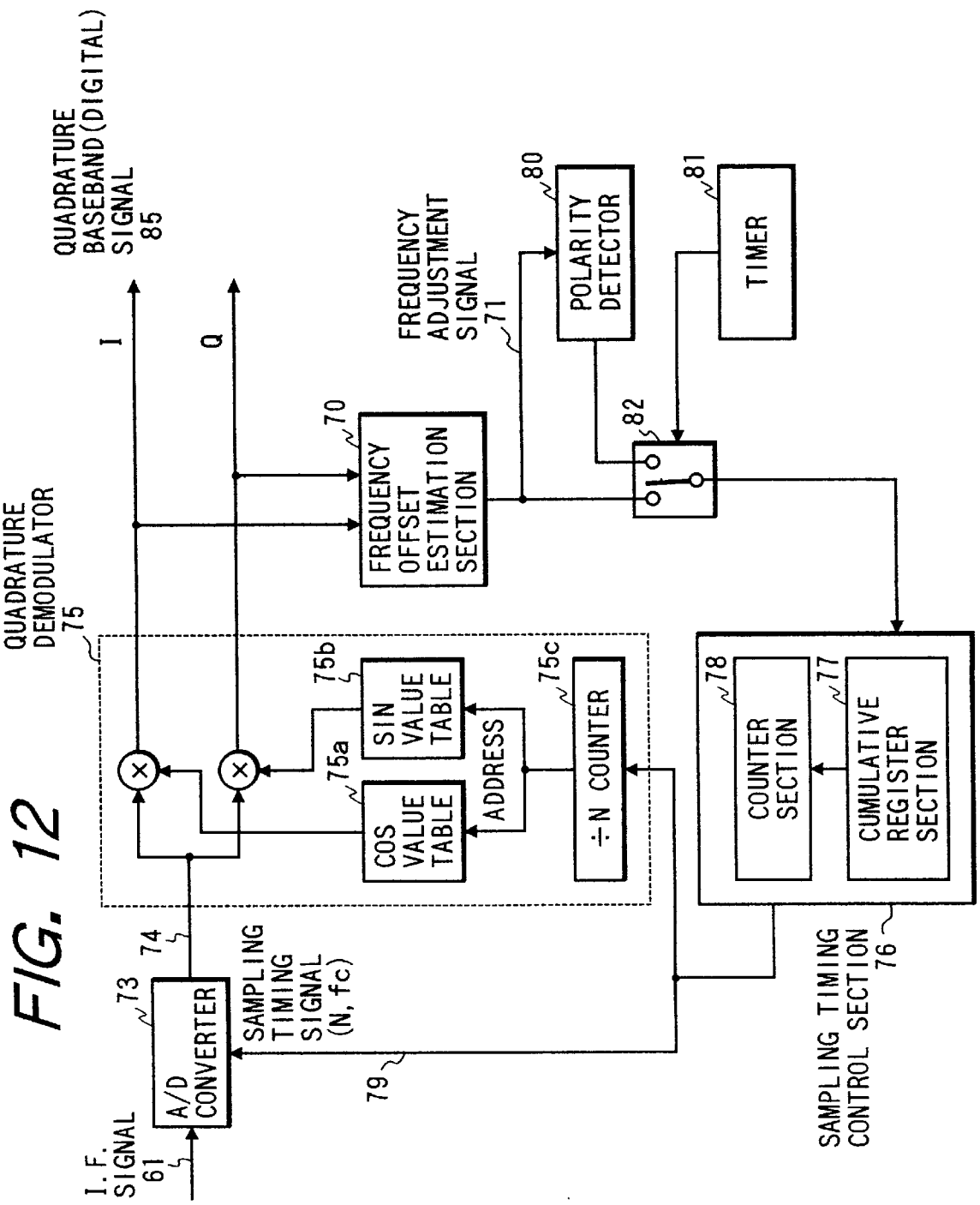
FIG. 12 is a general system block diagram of a modification of the embodiment of FIG. 11, whereby the values attainable by a frequency adjustment signal are limited after a predetermined time has elapsed from applying power to the radio receiver.

FIG. 12 shows an example of an embodiment which is a modification of the fifth embodiment, whereby the above function is incorporated. A polarity detection section 80 receives the frequency adjustment signal 71, and produces a +1 or −1 output value in accordance with the polarity of a value supplied as the frequency adjustment signal 71. During a fixed time interval which elapses after power to the radio receiver is switched on, a timer 81 controls a switch 82 to supply the frequency adjustment signal 71 directly to the sampling timing control section 76. After that time interval has elapsed, the switch 82 is changed over to supply the output signal from the polarity detection section 80 to the sampling timing control section 76, in place of the frequency adjustment signal 71.

Figure 13:
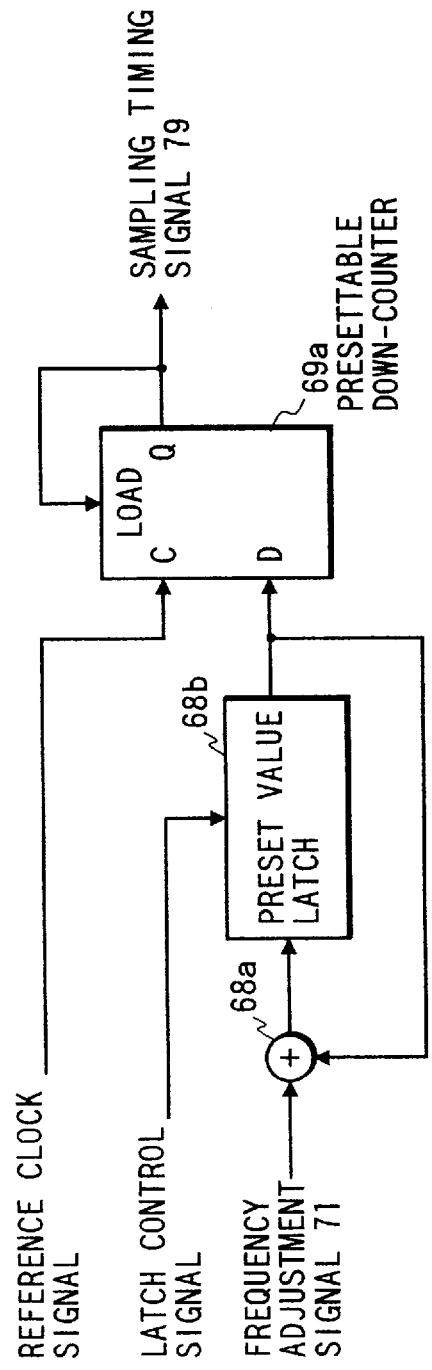
FIG. 13 shows details of the configuration of a sampling timing control section in the embodiment of FIG. 11.

The operation of the embodiment of FIG. 11 will be made more apparent by a description of a specific example of the internal configuration of the sampling timing control section 76, which will be given referring to the circuit diagram of FIG. 13. Here, a presettable down-counter 69a constitutes the presettable counter 78, while a combination of an adder 68a and a latch 68b constitutes the cumulative register section 77. The down-counter 69a counts down in synchronism with a reference clock signal, from an initial count value. Each time the count reaches zero, the resultant transition of the counter output signal (i.e. which constitutes the sampling timing signal 79) loads into the counter the value which is being supplied to the "data input" D terminals (i.e. the value that is held in the latch 68b) as the next initial count value. Thus, the period of the sampling timing signal is determined by the value which is being held in the latch 68b. Upon starting operation of the radio receiver, a predetermined reference value is set into the latch 68b. That reference value is determined such as to result in the period of the sampling timing signal 79 being appropriate for the condition when the frequency offset is zero (i.e. such as to make the sampling frequency N times the nominal value of the carrier frequency, with N-times oversampling of the I.F. signal). Since an arrangement for loading such an initial reference value into the counter 69a can easily be envisaged, details are omitted from the drawing.

Each time the frequency offset estimation section 70 executes a frequency offset estimation operation and generates an updated value of the frequency adjustment signal 71, a control signal is applied to the latch 68b whereby that updated estimate value is added to the previous value held in latch 68b and the result stored in latch 68b, thereby updating the value held in latch 68b. The period of the sampling timing signal 79 is thereby gradually adjusted in accordance with successive values of the frequency adjustment signal 71.

Figure 14:
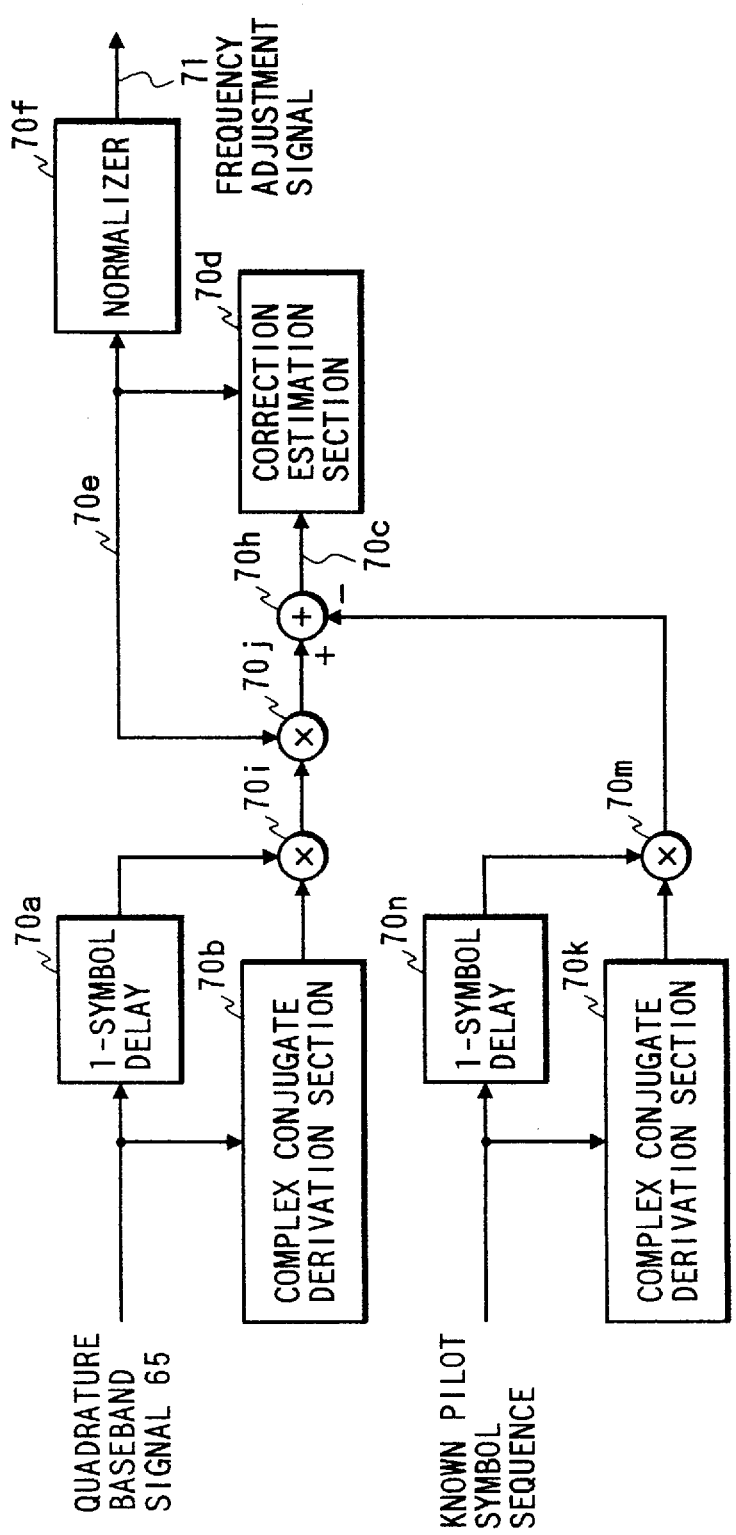
FIG. 14 shows details of the configuration of a frequency offset estimation section in the embodiment of FIG. 11.

Various methods can be envisaged for obtaining information expressing the frequency offset, however it will be assumed in the following that with this embodiment, the frequency offset is estimated based upon an amount of phase angle rotation (error) which occurs between successive symbols of the received pilot symbol sequence. That error can readily be obtained, by using the aforementioned known (i.e. locally stored) pilot symbol sequence as a reference. FIG. 14 shows an example of a suitable configuration for the frequency offset estimation section 70 of this embodiment, for executing such a frequency offset estimation operation. To simplify the drawing, pairs of signal lines which convey quadrature signals are shown as single lines (i.e. all of the signal lines, other than that of the frequency adjustment signal 71). Each of successive samples of the quadrature baseband signal 65 is supplied to a delay element 70a (such as that in the example of FIG. 5) producing a delay of one symbol period, and to a complex conjugate derivation section 70b, with the resultant complex conjugate value being multiplied in a multiplier 70i by the sample value of the preceding symbol period, from the delay element 70b, to thereby obtain the vector difference between the current sample and the delayed sample of the quadrature baseband signal. Each such vector difference value is multiplied by a compensation vector (described hereinafter) in a multiplier 70j, and the resultant compensated vector difference value is supplied to one input of a subtractor 70h.

It will be assumed in the following that only one pair of symbols of the pilot symbol sequence is utilized in this operation, although it would be equally possible to utilize a plurality of successive pairs of symbols. As the samples of that pair of pilot symbols are successively received in the demodulated quadrature baseband signal, the vector difference value for the corresponding pair of symbols of the locally stored pilot symbol sequence is supplied to a subtractor 70h in synchronism with the vector difference value for the aforementioned pair of received symbols of the pilot symbol sequence. This is done by sequentially reading out the known symbol pair from a register or memory in synchronism with the timings of the corresponding received pair of symbols of the pilot symbol sequence, and deriving the vector difference between these (using a delay 70n, complex conjugate derivation section 70k, multiplier 70m as shown). It will be clear that the timing of that operation can be appropriately controlled by a timing signal utilizing the aforementioned correlation signal as a reference, as described hereinabove, so that detailed description will be omitted.

The resultant difference vector value 70c is supplied to a correction estimation section 70d. It will be understood that the phase angle component (i.e. the argument, if the values are considered as complex numbers) of each of the difference values 70c expresses an amount of phase rotation error which has arisen in the period between one symbol and the preceding symbol conveyed by the received radio signal, i.e. an error whose direction and magnitude is determined by the frequency offset.

When the error vector 70c between these two successive symbols (e.g. first and second symbols) of the pilot symbol sequence is obtained and supplied to the correction estimation section 70d, section 70d derives a compensation vector 70e which, when multiplied with the vector difference value from multiplier 70i, will minimize the square of the vector error value 70c. The received vector difference value is multiplied by that compensation vector value 70e in the multiplier 70j, and the result is supplied to the subtractor 70h to obtain the aforementioned error vector 70c. By normalizing the compensation vector 70f, the angle of that vector with respect to the in-phase axis (i.e. $\tan^{-1}$ the ratio of the Q and I components of the normalized compensation vector) is obtained, i.e. a value which indicates the amount and direction of the frequency offset as an amount of vector rotation error between successively received symbols. It will be assumed that this value is output as the frequency adjustment signal 71. However it would be equally possible to utilize the Q (quadrature) component of the normalized compensation vector as the quantity indicative of the frequency offset. It can thus be understood that the basis of the operation is to periodically derive from a compensation vector value a corresponding value of the frequency adjustment signal 71, indicative of an estimated amount and direction of frequency offset.

Although the operation has been described above with respect to the phase rotation error between a single pair of received symbols, it will be apparent that it would be equally possible to obtain and use the respective amounts of phase rotation error for a plurality of successive pairs of symbols of the received pilot symbol sequence, to obtain information indicative of the frequency offset.

It will further be apparent that various alternative configurations for the frequency offset estimation section of FIG. 14 could be envisaged, to provide similar results. The essential point is that at each frequency offset estimation operation, a value should be obtained which indicates the amount of erroneous phase angle rotation that occurs between successive symbols of the pilot symbol sequence.

It should also be noted that it would be possible to employ other methods of estimating the frequency offset. For example, the offset could be estimated based upon changes made in the coefficients of the adaptive equalizer while the received pilot symbol sequence is being processed.

With this embodiment, the count period of the sampling timing control section 67 is increased if the estimated frequency offset is found to be positive, i.e. the frequency of the received carrier frequency is lower than that of the quadrature reference signal used in the quadrature demodulator 75, and is decreased if the estimated frequency offset is found to be negative.

That is to say, the term "positive value of the estimated frequency offset" corresponds to the condition in which the sampling frequency of the A/D converter 73 (and so, the frequency with which successive phase angle sample values are generated in the quadrature demodulator 75 as the quadrature reference signals) is higher than the correct value in relation to the received carrier frequency, while "negative value of the estimated frequency offset" corresponds to the condition in which the sampling frequency of the A/D converter 73 is lower than the correct value.

Thus with this embodiment it is made unnecessary to employ a complex circuit arrangement, such as a control loop acting on a VCO or VCXO which generates a reference frequency signal for down-conversion to the carrier frequency, for frequency control to synchronize the quadrature demodulation operation of the radio receiver with the carrier frequency of the received signal. This has the advantage that the need for component adjustment can be eliminated, and the functions of the overall receiver system can be implemented substantially entirely by digital technology. Hence, the system configuration can be made more simple than has been possible in the prior art, and the radio receiver can be substantially entirely formed on a single integrated circuit chip.

A sixth embodiment of the invention will now be described. The objectives and operation of this embodiment are basically similar to those of the fifth embodiment described above, however there is an essential difference in operation, which will be described referring to FIG. 15. In FIG. 15, diagram (a) illustrates successive phase angles attained by the received carrier during part of a cycle (i.e. a part in which no phase change occurs). Diagram (b) shows an example of the corresponding phase angles which might be attained at each of respective sampling timing points if there is a substantial frequency offset, by the (sin, cos) demodulation reference signals used in the quadrature demodulator 75 of the fifth embodiment described above, again assuming that the sampling frequency is four times the carrier frequency. In that case, the sampling period is adjusted until the frequency offset is cancelled. However the respective phase angles for which the cos, sin values (i.e. 0, 1, 0, −1, 0, etc.) of the quadrature reference signals are obtained at successive sampling timing points are fixed, with that embodiment.

With the sixth embodiment of the invention the same effect of cancelling the frequency offset is obtained. However instead of adjusting the sampling period, a fixed sampling period is employed, while the amount of phase shift (i.e. phase angle rotation) of the (cos, sin) digital reference signals used in quadrature demodulation, which occurs between successive sampling timing points, is adjusted such as to compensate for the frequency offset. That can be understood from diagram (c) of FIG. 15. In that example (assuming a sampling frequency which is fixed at four times the nominal value of the received carrier frequency), instead of the phase angle rotation between successive sampling timing points being fixed at 90° as in diagram (b), it has been adjusted to 91°. As a result, cosine and sine values for angles 0°, 91°, 182°, 273°, etc. are successively generated as the quadrature demodulation reference signal values. It will be apparent that by appropriate adjustment of that amount of phase angle rotation, the frequency offset can be cancelled in that manner.

Figure 16:
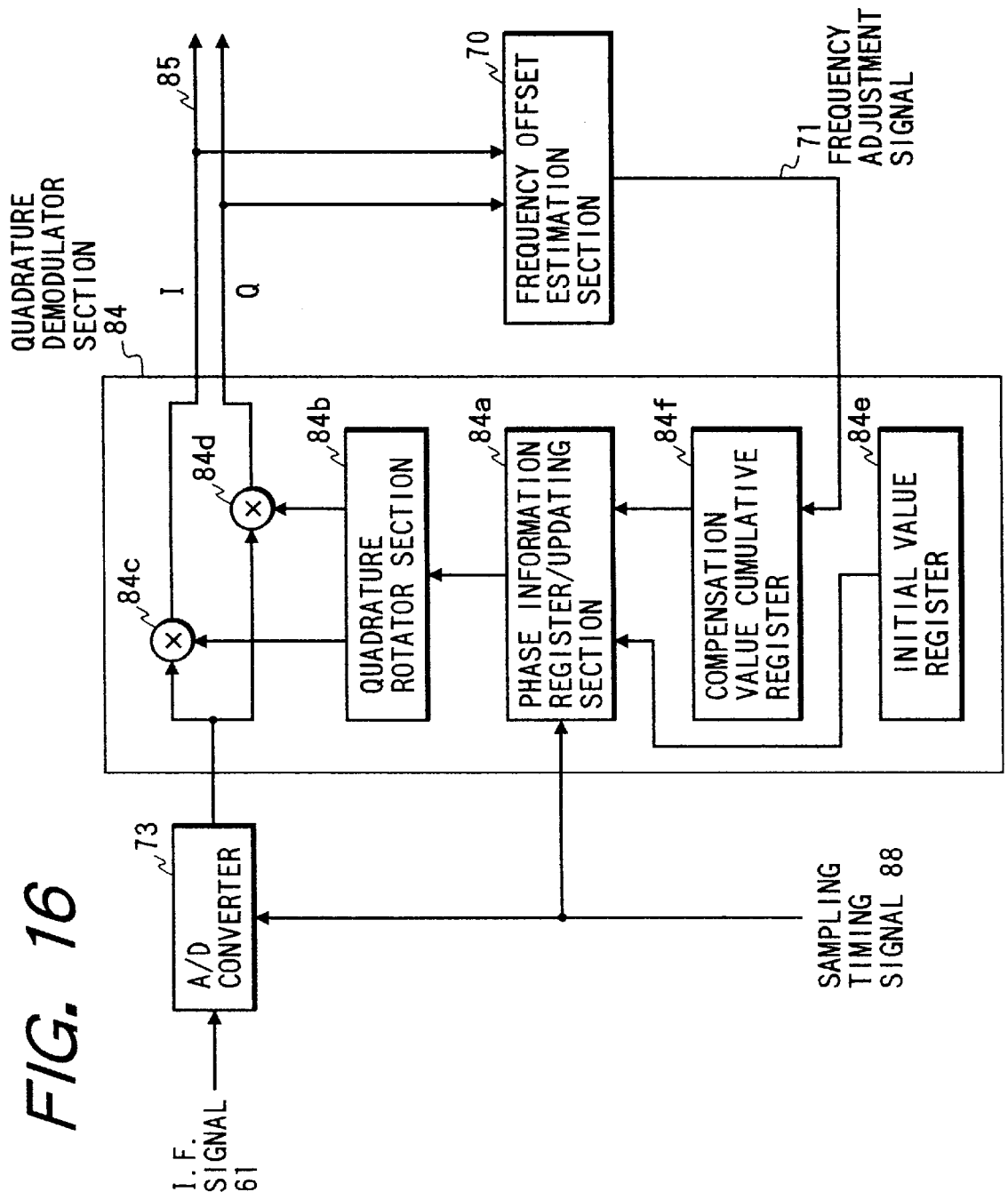
FIG. 16 is a general system block diagram of a second embodiment of an asynchronous quadrature demodulator according to the present invention for use in the demodulator section of a digital radio receiver, for deriving a digital quadrature baseband signal with compensation of frequency offset being based on control of phase angle values of digital quadrature reference signals utilized in a digital quadrature demodulation operation.

FIG. 16 is a general system block diagram of the sixth embodiment. This consists of an A/D converter 73 which converts the I.F. signal 61 to a stream of digital samples, at timings determined by a sampling timing signal 88. In this embodiment, the sampling timing signal 88 is a fixed-frequency timing signal, e.g. generated by a frequency synthesizer circuit. The digital I.F. signal samples from the A/D converter 73 are supplied to a quadrature demodulator 84, to obtain a digital quadrature baseband signal signal 85. This is supplied to a frequency offset estimation section 70, to periodically derive estimated values of frequency offset which are output as a frequency adjustment signal 71, and supplied to the quadrature demodulator 84. The operation and internal configuration of the frequency offset estimation section 70 can be as described for the preceding embodiment, so that further description will be omitted.

The quadrature demodulator 84 includes a compensation value cumulative register 84f which receives the estimated values of frequency offset, as signal 71. Here, as for the preceding embodiment, the term "cumulative register" signifies a register whose contents are periodically updated by adding a newly generated value to the previous register contents. The value held in the quadrature demodulator 84, together with a predetermined initial value which is held in a register 84e, are supplied to a phase information register/updating section 84a whose operation is controlled by the sampling timing signal 88. The phase information register/updating section 84a controls a quadrature rotator section 84b to periodically (i.e. at each sampling timing defined by signal 88) generate a new pair of quadrature reference (sine, cosine) signal values, supplied respectively to multipliers 84c, 84c, for demodulation of the I.F. signal to obtain the quadrature baseband signal 85. To simplify the drawing, the low-pass filters which must be connected to receive the output signals from the multipliers 84c, 84d for removing extraneous frequency components are not shown.

Figure 17:
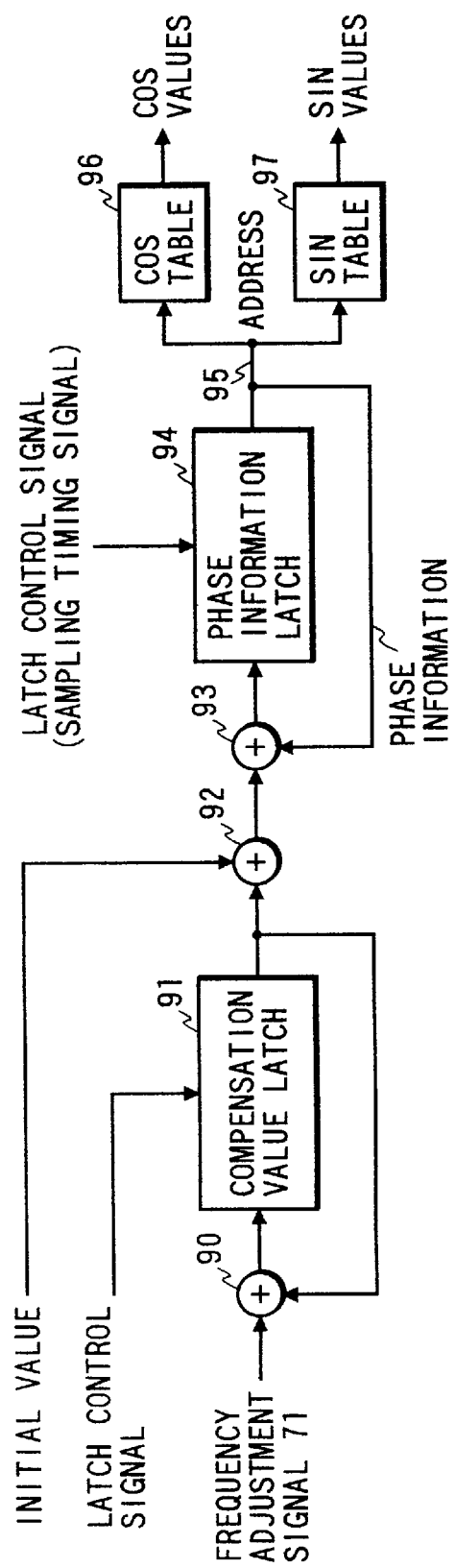
FIG. 17 is a partial system block diagram of a quadrature demdulator section in the embodiment of FIG. 16.

The operation of the quadrature demodulator 84 can be understood by referring to FIG. 17, which shows an example of a circuit arrangement for implementing the compensation value cumulative register 84f, phase information register/updating section 84a, quadrature rotator section 84b. The compensation value cumulative register 84f consists of a latch 91 and adder 90, for updating the contents of latch 91 by each new frequency offset estimate value that is supplied as signal 71. The operation of latch 91 is controlled by a timing signal which is generated each time that a new frequency offset estimation operation by the frequency offset estimation section 70 is completed.

The phase information register/updating section 84a consists of a phase information latch 94, whose operation is synchronized with the sampling timings of the A/D converter 73, an adder 92 which sums the value currently held in the compensation value latch 91 and the aforementioned initial value, and an adder 93 which updates the value held in the phase information latch 94 at each sampling timing.

The quadrature rotator section 84b consists of a pair of table memories, 96 and 97, which respectively generate the cosine and sine values corresponding to input (address) values which are supplied thereto. That is to say, the value held in the phase information latch 94 is interpreted as an angular value within the range 0° to 360°. The initial value which is supplied to the adder 92 expresses the amount of rotation (of the quadrature modulation reference signal phase angle) that should occur in each sampling timing period, if the amount of estimated frequency offset is zero. Assuming that the frequency of the sampling timing signal 88 is four times the nominal value of the carrier frequency, then the reference signal phase angle should be rotated by 90° in each sampling period. Thus if for example the system is assumed to start from a condition of zero frequency offset, with the value held in the latch 94 being zero, then that value will thereafter successively change in the sequence {0, 90, 180, 270, 0, etc.}. Thus the initial value should be set as 90.

If now a frequency offset estimate value of −1 is generated as signal 71, (e.g. representing a phase rotation error of 1° between two successive symbols of the received pilot symbol sequence as described above), then this will be set into the latch 91, so that 89 will be added to the contents of the phase information latch 94 in each sampling period. In that case, the value held in the phase information latch 94 will change in the sequence {0, 89, 178, 267, 356, 85, etc.}. Thus, the amount of phase rotation of the quadrature modulation (cos, sin) reference signals in each sample period has been changed from 90° to 89°.

It can thus be understood that this embodiment executes phase angle adjustment to compensate for a frequency offset, as described hereinabove referring to diagram (c) of FIG. 15. That is to say, rather than adjusting the sampling period of the I.F. signal (i.e. sampling which is synchronized with generating successive pairs of cos, sin values of the quadrature demodulation reference signals with a fixed value of phase angle rotation in each sampling period) under the control of the frequency compensation signal such as to compensate for the estimated frequency offset, as is done with the embodiment of FIG. 11, the sampling period is held constant. However, with the embodiment of FIG. 16, the amount of phase angle rotation of the cos, sin values of the quadrature demodulation reference signals which is executed in each sampling period is adjusted, under the control of the frequency compensation signal, such as to compensate for the estimated frequency offset.

In the same way as described for the embodiment of FIG. 11, it is possible to implement a modification of the embodiment of FIG. 16 whereby the possible values of the frequency adjustment signal 71 are limited to 1 and −1, to thereby ensure stable control of the frequency compensation.

Alternatively, also as described for the preceding embodiment, it would be possible to implement a modification of the embodiment of FIG. 16 whereby the successive values of the frequency compensation signal 71 are supplied directly to the quadrature demodulator 84 during a fixed time period after power to the radio receiver is switched on, while the values of the frequency compensation signal 71 are thereafter limited to 1 and −1, to ensure rapid attainment of frequency offset compensation after power switch-on together with stable compensation operation during conditions of adverse radio reception conditions.

It can be understood from the above that the embodiment of FIG. 16 also can eliminate the need to use a complex circuit arrangement which may employ analog circuit components, such as an AFC (Automatic Frequency Control) loop acting on a VCO for frequency control to synchronize the quadrature demodulation operation of the radio receiver with the carrier frequency of the received signal. Thus, the need for component adjustment can be eliminated, and the functions of the overall receiver system can be implemented by digital technology, making it possible to form substantially all of the radio receiver on a single integrated circuit chip.

Figure 18:
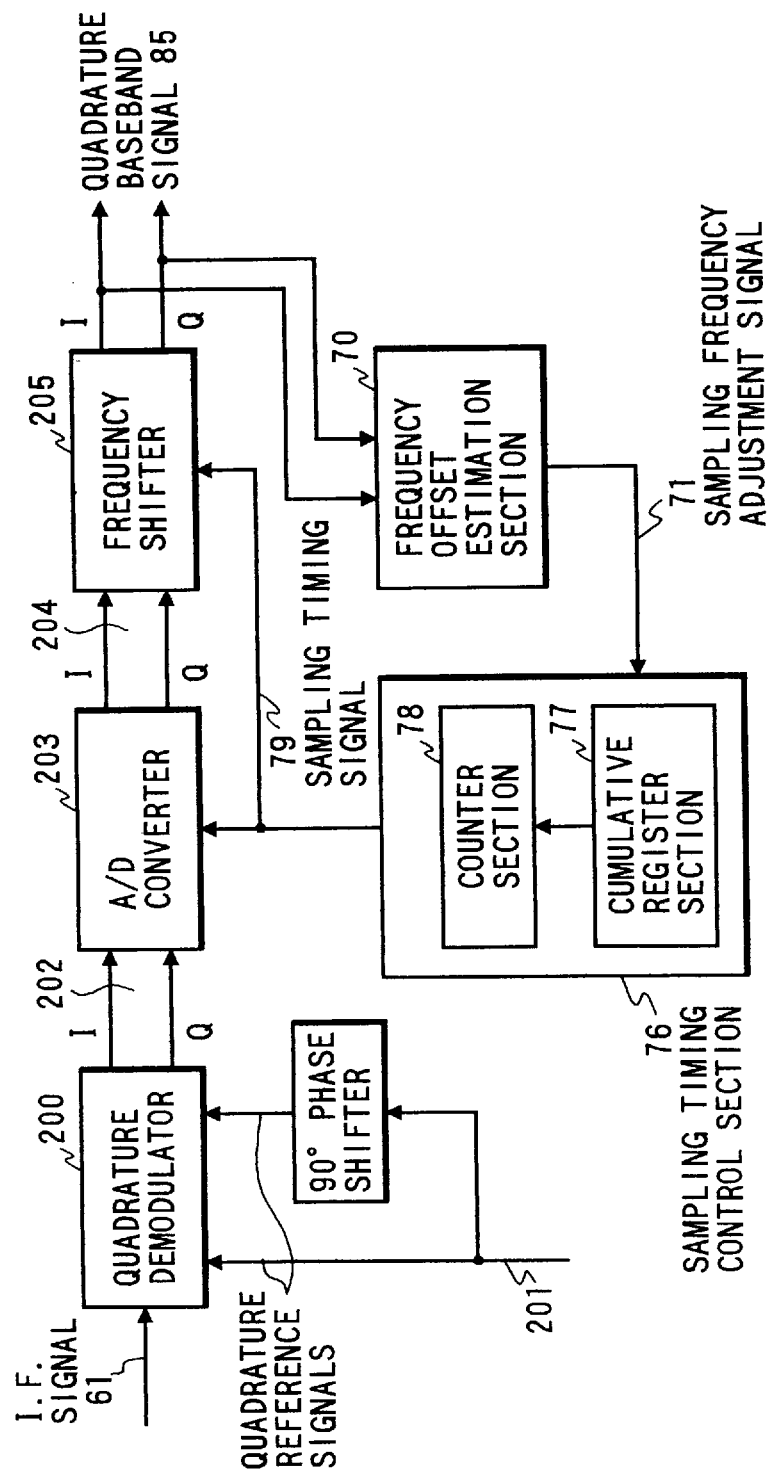
FIG. 18 is a general system block diagram of a third embodiment of an asynchronous quadrature demodulator according to the present invention for use in the demodulator section of a digital radio receiver, for deriving a digital quadrature baseband signal with frequency offset compensation being based on control of sampling timings when sampling a quadrature baseband signal which has been derived using a specific amount of applied frequency offset.

A seventh embodiment of the invention will be described in the following, having similar objectives to those of the fifth and sixth embodiments described above. The configuration of this embodiment is as shown in the general system block diagram of FIG. 18, in which system blocks and signals corresponding to those of the fifth embodiment are designated by identical reference numerals. With this embodiment, the I.F. signal 61 (i.e. the quadrature phase-shift modulated carrier) is demodulated to obtain a sampled quadrature baseband signal 85, using a symbol over-sampling factor of M times, where M is an integer which will be assumed in the following to be 4, i.e. there are 4 samples/symbol period.

Specifically, the I.F. signal 61 is first operated on in a quadrature modulator 200 by the usual analog quadrature demodulation process, i.e. multiplying by quadrature reference signals and filtering the resultant signals to obtain the I and Q branches of a quadrature signal 202. However in this embodiment, a specific amount of frequency offset is applied to the quadrature reference signals as described hereinafter. The quadrature signal 202 is then converted to digital form by an A/D converter 203, under the control of a sampling timing signal 79, and the resultant digital quadrature signal 204 is supplied to a frequency shifter 205, whose function is described hereinafter. An amount of frequency offset in the resultant output quadrature baseband signal 85 is periodically detected by a frequency offset estimation section 70, and a corresponding sampling frequency adjustment signal 71 derived, in the same manner as described for the fifth embodiment above, with the sampling timing signal 79 being thereby generated by the sampling timing control section 76.

With the over-sampling factor M, and designating the nominal value of the symbol frequency as $f_s$, the sampling frequency $f_{smp}$ of the A/D converter 203 (i.e. of the sampling timing signal 79) should be exactly $M.f_s$ if the frequency offset is zero.

With this embodiment, the quadrature reference signals utilized in the quadrature modulator 200 are derived as shown from a fixed-frequency reference signal 201, e.g. which is generated by a frequency synthesizer circuit. However instead of generating the reference signal 201 at nominal value $f_c$ of the received carrier, reference signal 201 is generated at a frequency $\{f_c+(f_{smp}/k)\}$, i.e. an intentional frequency offset of $(f_{smp}/k)$ is applied to the quadrature baseband signal, where k can be (in principle) be an integer equal to 1 or greater. In general, it will be preferable to make k=1. However for generality of description this embodiment will be described for the case in which k=2. To avoid confusion with the frequency offset (error), as normally understood by that term, the intentional frequency offset will be referred to in the following as the "applied offset".

The basic principles of this embodiment, for the case in which k is equal to 2, will be described referring to the normalized vector diagrams of FIGS. 19a, 19b, 20a, 20b. It will be assumed, for simplicity of description, that the signal received by the radio receiver is such that if conventional quadrature demodulation were performed (i.e. without the aforementioned applied offset) at the sampling timings of the A/D converter 203 the quadrature baseband signal 204 would take successive values b0, b1, b2, b3, b4, b5, . . . , where b0 is identical to b1, b2 is identical to b3, and so on. However if the applied offset of exactly $(f_{smp}/2)$ is superimposed in demodulation to the baseband signal, then the resultant quadrature sample values b0, b1, b2, b3, would be obtained as shown in the vector diagram of FIG. 19a, i.e. with every second sample value being phase-rotated by 180°, but with the vectors being stationary (i.e. in relation to the sampling time points).

Figure 19A:
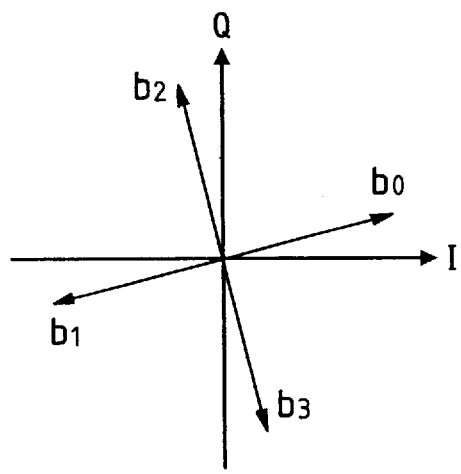
FIGS. 19A, 19B and 20A, 20B are vector diagrams for assistance in describing the operating principles of the embodiment of FIG. 18.
Figure 19B:
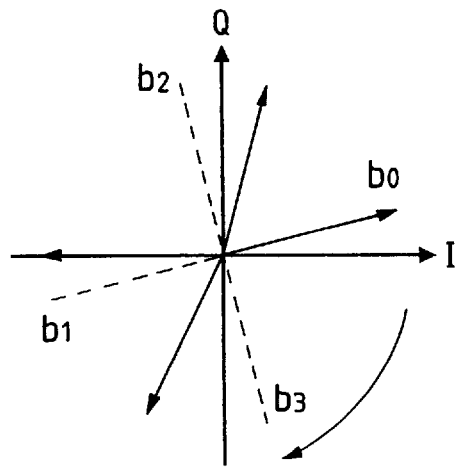

If however, in addition to the applied offset of $(f_{smp}/2)$ there is an error frequency offset, then, the signal vectors will no longer be stationary, but will rotate, as indicated in FIG. 19b.

Figure 20A:
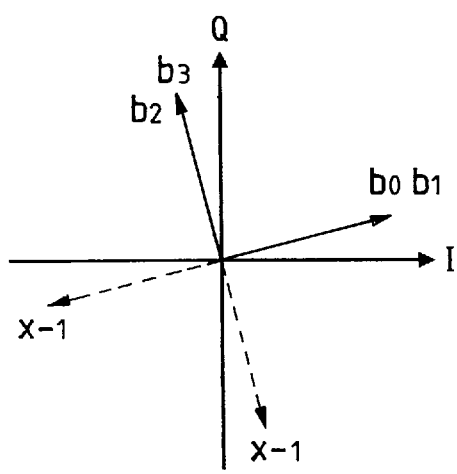
Figure 20B:
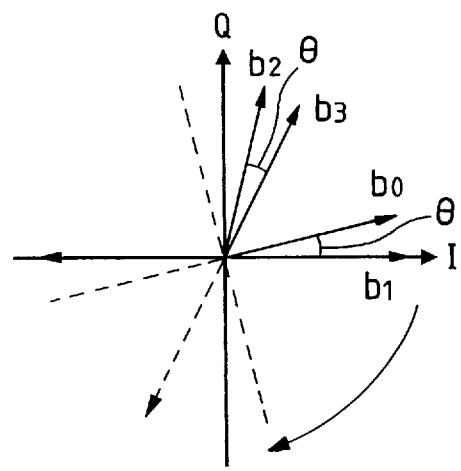
Figure 21:
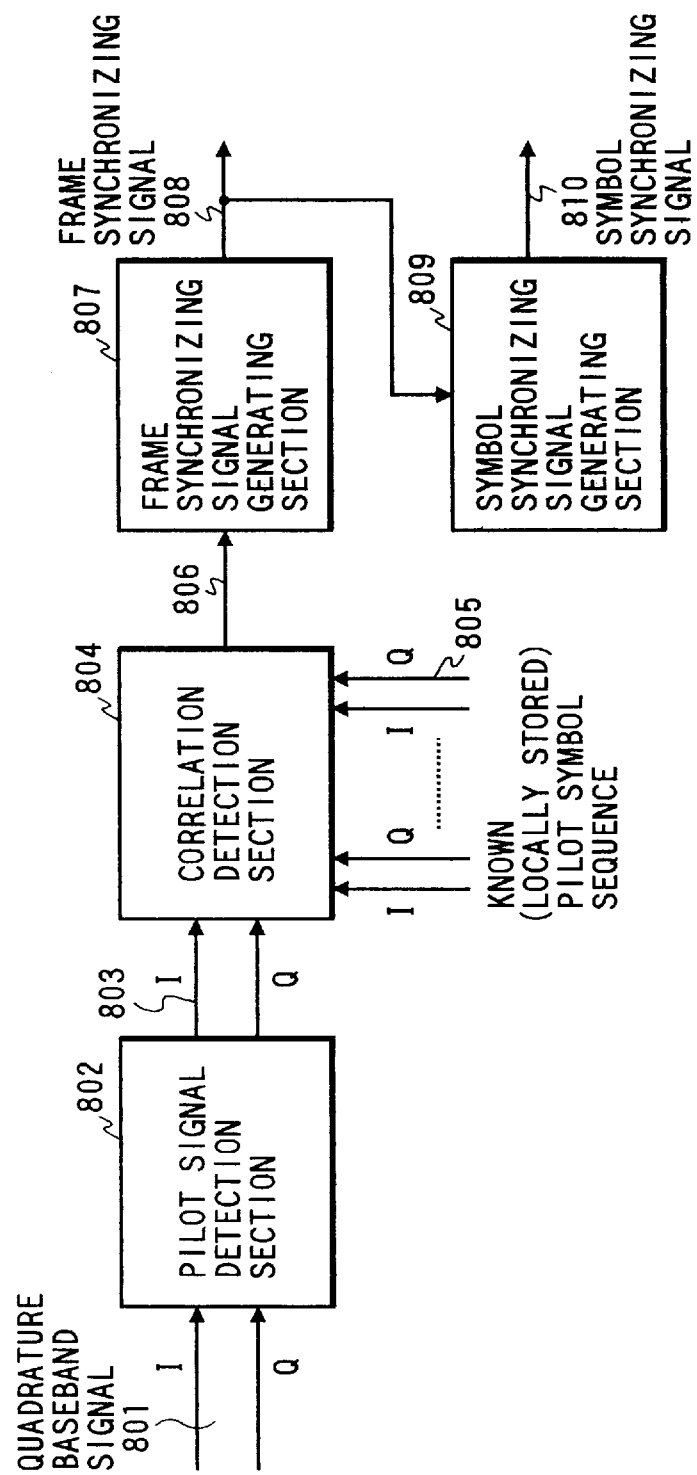
FIG. 21 is a general system block diagram for assistance in describing the essential principles of prior art types of frame synchronizing signal generating circuit for use in the demodulator section of a digital radio receiver.
Figure 22:
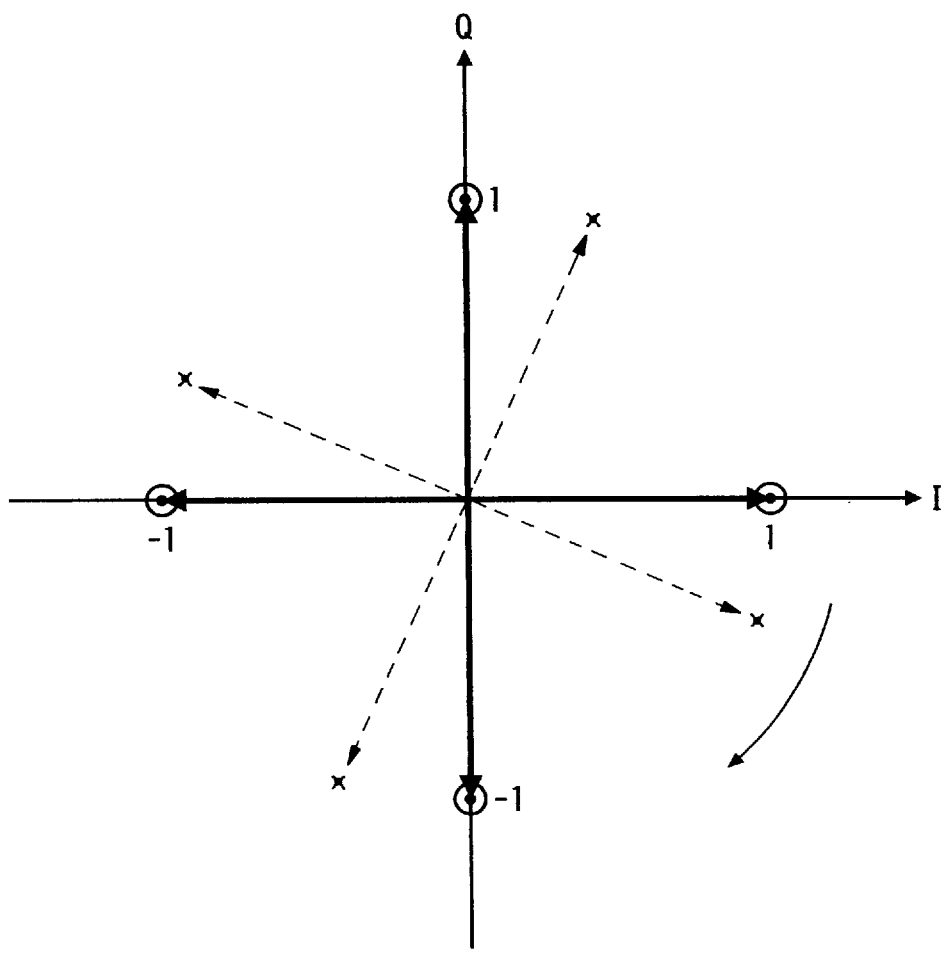
FIG. 22 is a vector diagram for illustrating the effect of a frequency offset on quadrature demodulation operations for obtaining a baseband signal.

With this embodiment, the operation of the frequency shifter 205 is synchronized with the sampling timing signal 79, and functions to phase-rotate every second sample of the quadrature baseband signal 204 through 180°, i.e. successively multiplies each of the I and Q components of respective samples of that quadrature baseband signal by 1, −1, 1, −1, and so on in succession. If there is no error frequency offset, then the result of that operation is as shown in FIG. 20a, i.e. the successive samples b0, b1, b2, b3 are set into the correct relationship, with the signal vectors being stationary in the I-Q plane. However if there is a frequency offset, then sample b1 will not be set into phase angle coincidence with sample b0, i.e. there will be an angle Θ between these, (similarly for samples b2, b3), and the signal vectors will rotatate, as shown in FIG. 20b.

With the present embodiment, that amount of (error) frequency offset is periodically determined by the frequency offset estimation section 70, which operates on the output quadrature baseband signal 85 in the same manner as described for the fifth embodiment, with the frequency of the sampling timing signal 79 being modified accordingly based on the sampling frequency adjustment signal 71 (as described hereinabove for the fifth embodiment), in a direction such as to eliminate the unwanted frequency offset. The angle Θ of FIG. 20b is thereby reduced towards zero, and the signal vectors set in the correct relationship.

Although the term quadrature baseband signal is used in this description for signals 202, 204, it can be understood that these are not true baseband signals, due to the frequency component that is introduced by the applied offset in this case. The applied offset of $(f_{smp}/2)$ has the effect of shifting the spectrum of the "quadrature baseband signal" 204, while the frequency shifter 205 has the opposite, compensating effect, so that a true quadrature baseband signal 85 is obtained as output.

It will be understood that each operation of "multiplying by −1" performed by the frequency shifter 205 on alternate samples of the quadrature baseband signal 204 can be a simple digital number conversion, i.e. performed without executing an actual multiplication operation. Hence there is no significant increase in circuit complexity as a result of utilizing the frequency shifter 205.

If on the other hand the value of k is made equal to 1, i.e. the applied offset is made equal to $f_{smp}$ so that there is exactly one complete signal vector rotation of the quadrature signal 202 in each sampling period (in the absence of frequency offset), then the sampling time points defined by signal 79 will be correctly synchronized with the demodulated signal 202, so that the frequency shifter 205 would not actually be required. In other respects, the operation is as described above for the case of k being equal to 2.

In the same way as described for the fifth embodiment above, it would be possible to limit the values which the sampling frequency adjustment signal 71 may attain to 1 and −1, thereby ensuring greater stability of compensation. Alternatively, as also described for the fifth embodiment, the sampling frequency adjustment signal 71 could express respective amounts of estimated frequency offset during a fixed time interval after power is applied to the radio receiver, and could thereafter be limited to the values 1 and −1.

It can be understood from the above that this embodiment enables similar results to be obtained to those described for the fifth and sixth embodiments of the invention, i.e. enabling accurate frequency offset compensation without the need to provide a continuously-operating feedback control loop (AFC loop) for frequency control of the quadrature demodulation process, thereby making it easier to implement most of the functions of the radio receiver by digital circuit techniques.

It will be understood that by employing the techniques described hereinabove based on the first, second, third and/or fourth embodiments, stable and accurate generation of the frame synchronizing signal can be achieved even under conditions of intermittent adverse radio reception conditions, e.g. during heavy multi-path fading, and that such a stable frame synchronizing signal can be utilized to ensure that stable and accurate timing can be achieved for operations which are necessary in frequency offset estimation (e.g. providing the known pilot symbol vector difference values at the correct times for comparison with the corresponding vector difference values from the received quadrature baseband signal) i.e. timing of operations which are necessary for accurately estimating the frequency offset with the fifth, sixth or seventh embodiment.

As can be understood from the above description, the invention is applicable in general to a receiver of a TDM digital data radio communication system in which data are transmitted in phase-quadrature modulation form in successive frame periods, with each frame period including a predetermined pilot symbol sequence that is known to the receiver.

What is claimed is:

1. Demodulator means for a time-division multiplex digital radio communication receiver, said receiver comprising means for converting a received radio-frequency signal to an intermediate-frequency signal in the form of a phase quadrature modulated carrier, said demodulator means comprising means for sampling and demodulating said modulated carrier to obtain a sampled quadrature baseband signal expressing successive sets of symbols in respective fixed-length frame periods with each set including a predetermined pilot symbol sequence, and frame synchronizing signal derivation means comprising:
memory means having said predetermined pilot symbol sequence stored therein,
means for deriving respective normalized first vector difference values between each of adjacent pairs of symbols of said stored pilot symbol sequence,
means for successively deriving respective normalized second vector difference values between each of adjacent pairs of samples of said sampled quadrature baseband signal which are time-axis separated by an amount equal to one symbol period,
means for sequentially comparing said second vector difference values with said first vector difference values, to obtain a correlation signal,
dispersion calculation means for periodically calculating an amount of dispersion of said correlation signal,
comparator means for comparing said amount of dispersion with a predetermined dispersion threshold value, to obtain a correlation threshold value as a comparison result, and
frame synchronizing signal generating means controlled by said correlation signal and said correlation threshold value for generating a frame synchronizing signal which is synchronized with said frame periods.

2. Demodulator means for a time-division multiplex digital radio communication receiver, said receiver comprising means for converting a received radio-frequency signal to an intermediate-frequency signal in the form of a phase quadrature modulated carrier, said demodulator means comprising means for sampling and demodulating said modulated carrier to obtain a sampled quadrature baseband signal expressing successive sets of symbols, each set including a predetermined pilot symbol sequence, in respective fixed-length frame periods, and frame synchronizing signal derivation means comprising:
memory means having said predetermined pilot symbol sequence fixedly stored therein,
means for deriving respective normalized first vector difference values between each of adjacent pairs of symbols of said stored pilot symbol sequence,
means for successively deriving respective normalized second vector difference values between each of adjacent pairs of samples of said sampled quadrature baseband signal which are time-axis separated by an amount equal to one symbol period,
means for sequentially comparing said second vector difference values with said first vector difference values, to obtain a correlation signal,
maximum value detection means for detecting a maximum value of said correlation signal in each of said frame periods, to produce a maximum value detection signal,
comparator means for comparing said maximum value detection signal with a correlation threshold value, to obtain a comparison signal,
correlation threshold value determining means controlled by said comparison signal for producing said correlation threshold value, and
frame synchronizing signal generating means controlled by said correlation signal and said correlation threshold value for generating a frame synchronizing signal which is synchronized with said frame periods.

3. A demodulator apparatus according to claim 1, wherein said frame synchronizing signal generating means comprises means for detecting respective amounts of phase error between said correlation signal and said frame synchronizing signal in respective ones of said frame periods, means for obtaining a cumulative value of said phase error over a plurality of successive frame periods, means for detecting when an absolute value of said cumulative phase error exceeds said correlation threshold value, and means for adjusting the phase of said frame synchronizing signal in accordance with said cumulative value of phase error when said correlation threshold value is exceeded.

4. Demodulator means for a time-division multiplex digital radio communication receiver, said receiver comprising means for converting a received radio-frequency signal to an intermediate-frequency signal in the form of a phase quadrature modulated carrier, said demodulator means comprising means for sampling and demodulating said modulated carrier to obtain a sampled quadrature baseband signal expressing successive sets of symbols, each set including a predetermined pilot symbol sequence, in respective fixed-length frame periods, and controlled adaptive equalizing means comprising:

memory means having said predetermined pilot symbol sequence fixedly stored therein, means for deriving respective normalized first vector difference values between each of adjacent pairs of symbols of said stored pilot symbol sequence, means for successively deriving respective normalized second vector difference values between each of adjacent pairs of samples of said sampled quadrature baseband signal which are time-axis separated by an amount equal to one symbol period, means for sequentially comparing said second vector difference values with said first vector difference values, to obtain a correlation signal, dispersion calculation means for periodically calculating an amount of dispersion of said correlation signal, comparator means for comparing said amount of dispersion with a predetermined dispersion threshold value, to obtain a correlation threshold value as a comparison result, an adaptive equalizer for sequentially processing said extracted quadrature values to obtain a stream of quadrature values to be decoded for recovering originally transmitted data, said processing being controlled based on said correlation threshold value.

5. A demodulator apparatus according to claim 4, comprising means controlled by said correlation threshold value for selecting a stream of output quadrature values produced from said adaptive equalizer to be decoded to recover said data when said correlation threshold value is at a first predetermined level and for directly selecting said extracted quadrature values to be decoded to recover said data when said correlation threshold value is at a second predetermined level.

6. Demodulator means for a time-division multiplex digital radio communication receiver, said receiver comprising means for converting a received radio-frequency signal to an intermediate-frequency signal in the form of a phase quadrature modulated carrier, said demodulator means comprising means for sampling and demodulating said modulated carrier to obtain a sampled quadrature baseband signal expressing successive sets of symbols, each set including a predetermined pilot symbol sequence, in respective fixed-length frame periods, means for extracting quadrature values expressing said symbols from said sampled quadrature baseband signal, an adaptive equalizer for processing said extracted quadrature values to obtain successive equalized quadrature values expressing respective equalized symbols, and frame synchronizing signal derivation means comprising:

memory means having said predetermined pilot symbol sequence fixedly stored therein, means for deriving respective normalized first vector difference values between each of adjacent pairs of symbols of said stored pilot symbol sequence, means for successively deriving respective normalized second vector difference values between each of adjacent pairs of samples of said sampled quadrature baseband signal which are time-axis separated by an amount equal to one symbol period, means for sequentially comparing said second vector difference values with said first vector difference values, to obtain a first correlation signal, means for successively deriving respective normalized third vector difference values between each of adjacent pairs of said equalized quadrature values, the values of each said pair being time-axis separated by one symbol period, means for sequentially comparing said third vector difference values with said first vector difference values, to obtain a second correlation signal, delay means acting on at least one of said first and second correlation signals to compensate for effects of a time-axis deviation between said samples of said sampled quadrature baseband signal and corresponding ones of said equalized quadrature values, means for combining said first correlation signal and said second correlation signal to obtain a combined correlation signal, and frame synchronizing signal generating means controlled by said combined correlation signal for generating a frame synchronizing signal which is synchronized with said frame periods.

7. Demodulator means according to claim 6, wherein said means for combining said first correlation signal and said second correlation signal comprise means for summing said first correlation signal and said second correlation signal.

8. Demodulator means for a time-division multiplex digital radio communication receiver, said receiver comprising means for converting a received radio-frequency signal to an intermediate-frequency signal in the form of a phase quadrature modulated carrier, said demodulator means including asynchronous baseband demodulator means for converting said intermediate frequency signal to a digital quadrature baseband signal formed of successive quadrature signal samples, comprising:

frequency offset estimation means for executing frequency offset estimation operations to periodically generate respective frequency adjustment values each indicative of an updated estimated value of frequency offset, sampling timing control means responsive to said frequency adjustment values for controlling the frequency of a sampling timing signal, said sampling timing signal frequency being predetermined as taking a value which is N times a nominal value of carrier frequency of said modulated carrier when said frequency offset is zero, where N is a plural integer, analog-to-digital conversion means for converting said intermediate-frequency signal to digital sample values in synchronism with said sampling timing signal, means for deriving successive phase angle values in the range 0° to 360°, with successive increments of 360°/N, in synchronism with said sampling timing signal, means for deriving respective cosine and sine values of each of said phase angle values, means for multiplying each of said digital sample values by said cosine and sine values, to obtain in-phase and quadrature components of a corresponding one of said quadrature signal samples.

9. Demodulator means according to claim 8, wherein said sampling timing control means of said asynchronous baseband demodulator means comprises:

cumulative register means for holding a counter preset value which is successively updated by sequential ones of said frequency adjustment values, and presettable counter means coupled to continuously count successive periods of a reference clock signal, and adapted to load therein said counter preset value as an initial count value each time that a predetermined count value is attained.

10. Demodulator means for a time-division multiplex digital radio communication receiver, said receiver comprising means for converting a received radio-frequency signal to an intermediate-frequency signal in the form of a phase quadrature modulated carrier, said demodulator means including asynchronous baseband demodulator means for converting said intermediate frequency signal to a digital quadrature baseband signal formed of successive quadrature signal samples, comprising:

frequency offset estimation means for executing frequency offset estimation operations to periodically generate respective frequency adjustment values each indicative of an updated estimated value of frequency offset, means for supplying a fixed-frequency sampling timing signal, having a frequency which is N times a nominal value of frequency of said carrier, analog-to-digital conversion means for converting said intermediate-frequency signal to respective digital sample values in synchronism with said sampling timing signal, phase information register means for holding phase information expressing a phase angle value in the range 0° to 360°, means for deriving a compensation value which is controlled in accordance with said frequency adjustment values, means for periodically updating said phase information by adding thereto the sum of a predetermined initial value and said compensation value, in synchronism with said sampling timing signal, means for deriving respective cosine and sine values of said phase angle value held as said phase information, and means for multiplying each of said digital sample values by said cosine and sine values, to obtain in-phase and quadrature components of a corresponding one of said quadrature signal samples, wherein said initial value is predetermined as being equal to 360°/N.

11. Demodulator means according to claim 10, wherein said means for deriving said compensation value comprise cumulative register means for holding a cumulative compensation value which is successively updated by sequential ones of said frequency adjustment values.

12. Demodulator means for a time-division multiplex digital radio communication receiver, said receiver comprising means for converting a received radio-frequency signal to an intermediate-frequency signal in the form of a phase quadrature modulated carrier, said demodulator means including asynchronous baseband demodulator means for converting said intermediate frequency signal to a digital quadrature baseband signal expressing successive sets of symbols in respective fixed-length frame periods, said digital quadrature baseband signal formed of quadrature signal samples derived using a symbol over-sampling factor of m, where m is a plural integer, said baseband demodulator means comprising:

frequency offset estimation means for executing frequency offset estimation operations to periodically generate respective frequency adjustment values each indicative of an updated estimated value of an error frequency offset, means for supplying a fixed-frequency signal having a reference frequency which differs from a nominal frequency value of said modulated carrier by an amount $f_{smp}$, where $f_{smp}$ is equal to a nominal value of symbol frequency of said symbols multiplied by said oversampling factor m, and for obtaining quadrature reference signals varying at said reference frequency, quadrature demodulator means for multiplying said intermediate frequency signal by said quadrature reference signals to obtain a frequency-shifted quadrature baseband signal having an applied frequency offset of $f_{smp}$, sampling timing control means responsive to said frequency adjustment values for controlling the frequency of a sampling timing signal, said sampling timing signal frequency being predetermined as taking a value which is equal to said amount $f_{smp}$ when said error frequency offset is zero, and analog-to-digital conversion means for converting said frequency-shifted quadrature baseband signal to digital sample values in synchronism with said sampling timing signal, to obtain said digital quadrature baseband signal.

13. Demodulator means for a time-division multiplex digital radio communication receiver, said receiver comprising means for converting a received radio-frequency signal to an intermediate-frequency signal in the form of a phase quadrature modulated carrier, said demodulator means including asynchronous baseband demodulator means for converting said intermediate frequency signal to a digital quadrature baseband signal expressing successive sets of symbols in respective fixed-length frame periods, said digital quadrature baseband signal formed of quadrature signal samples derived using a symbol over-sampling factor of m, where m is a plural integer, said baseband demodulator means comprising:

frequency offset estimation means for executing frequency offset estimation operations to periodically generate respective frequency adjustment values each indicative of an updated estimated value of an error frequency offset, means for supplying a fixed-frequency signal having a reference frequency which differs from a nominal frequency value of said modulated carrier by an amount $f_{smp}/2$, where $f_{smp}$ is equal to a nominal value of symbol frequency of said symbols multiplied by said over-sampling factor m, and for obtaining quadrature reference signals varying at said reference frequency, quadrature demodulator means for multiplying said intermediate frequency signal by said quadrature reference signals to obtain a frequency-shifted quadrature baseband signal having an applied frequency offset of $f_{smp}/2$, sampling timing control means responsive to said frequency adjustment values for controlling the frequency of a sampling timing signal, said sampling timing signal frequency being predetermined as taking a value which is equal to said amount $f_{smp}$ when said error frequency offset is zero, analog-to-digital conversion means for converting said frequency-shifted quadrature baseband signal to digital sample values in synchronism with said sampling timing signal, to obtain a frequency-shifted digital quadrature baseband signal, and frequency shifter means controlled by said sampling timing signal for multiplying in-phase and quadrature-phase components of alternate samples of said frequency-shifted digital quadrature baseband signal by −1, to obtain said digital quadrature baseband signal.

14. Demodulator means according to claim 8, wherein said sampling timing control means of said asynchronous baseband demodulator means comprises:

cumulative register means for holding a counter preset value which is successively updated by sequential ones of said frequency adjustment values, and presettable counter means coupled to continuously count successive periods of a reference clock signal, and adapted to load therein said counter preset value as an initial count value each time that a predetermined count value is attained.

15. Demodulator means according to claim 8, wherein said frequency offset estimation means of said asynchronous baseband demodulator means comprises means for deriving, as a frequency adjustment value, a scalar quantity which is indicative of an amount of phase rotation error between received quadrature signal values expressing successive symbols.

16. Demodulator means according to claim 8, wherein said sampled quadrature baseband signal expresses successive sets of symbols in respective fixed-length frame periods with each set including a predetermined pilot symbol sequence, and wherein said demodulator means includes memory means having said predetermined pilot symbol sequence stored therein, said frequency offset estimation means of said asynchronous baseband demodulator means comprising:

means for deriving a first vector difference value indicative of an amount of phase rotation between two samples of two successive received symbols of said pilot symbol sequence within said sampled quadrature baseband signal, said samples having a time-axis separation which is equal to one symbol period, means for deriving a second vector difference value indicative of an amount of phase rotation between two successive symbols of said stored pilot symbol sequence, said symbols corresponding to said two received symbols, means for applying a compensation vector value to said first vector difference value to obtain a compensated vector difference value, means for deriving a third vector difference value between said compensated vector difference value and said second vector difference value, correction estimation means responsive to said third vector difference value for estimating an appropriate value for said compensation vector value, and means for obtaining from said compensation vector value a frequency adjustment value as a scalar quantity which is indicative of said amount of frequency offset.

17. Demodulator means according to claim 11, further comprising means for limiting a range of values attainable by said frequency adjustment values to 1 and −1.

18. Demodulator means according to claim 11, further comprising control means for selectively establishing a first condition in which a range of values attainable by said frequency adjustment values is limited to 1 and −1, and a second condition in which said frequency adjustment values express said respective amounts of estimated frequency offset.

19. Demodulator means according to claim 18, wherein said control means functions to establish said first condition during a predetermined time interval following a commencement of operation of said radio receiver, and to establish said second condition thereafter.

* * * * *